(12) United States Patent
Chen et al.

(10) Patent No.: US 9,226,387 B2
(45) Date of Patent: Dec. 29, 2015

(54) NETWORK COMMUNICATION DEVICE

(71) Applicant: CYNTEC CO., LTD, Hsinchu (TW)

(72) Inventors: Chih-Tse Chen, Taipei (TW); Joseph D. S. Deng, Taoyuan (TW); Shih-Hsien Tseng, Zhubei (TW)

(73) Assignee: CYNTEC CO., LTD., Hsinchu (TW)

( * ) Notice: Subject to any disclaimer, the term of this patent is extended or adjusted under 35 U.S.C. 154(b) by 161 days.

(21) Appl. No.: 13/935,713

(22) Filed: Jul. 5, 2013

(65) Prior Publication Data
US 2014/0016289 A1    Jan. 16, 2014

Related U.S. Application Data

(60) Provisional application No. 61/668,461, filed on Jul. 6, 2012.

(51) Int. Cl.
| | |
|---|---|
| *H02B 5/00* | (2006.01) |
| *H05K 7/00* | (2006.01) |
| *H05K 1/02* | (2006.01) |
| *H05K 9/00* | (2006.01) |
| *H05K 1/00* | (2006.01) |
| *H05K 5/00* | (2006.01) |
| *H01H 9/28* | (2006.01) |
| *H01H 27/00* | (2006.01) |
| *H01H 47/00* | (2006.01) |
| *H01H 63/00* | (2006.01) |
| *H02B 7/00* | (2006.01) |
| *H02B 1/26* | (2006.01) |
| *H02B 1/00* | (2006.01) |

(52) U.S. Cl.
CPC ............... *H05K 1/0233* (2013.01); *H05K 1/00* (2013.01); *H05K 1/025* (2013.01); *H05K 1/0216* (2013.01); *H05K 5/00* (2013.01); *H05K 5/0026* (2013.01); *H05K 7/00* (2013.01); *H05K 9/0022* (2013.01); *H05K 1/0243* (2013.01)

(58) Field of Classification Search
CPC ......... H05K 5/00; H05K 7/00; H05K 5/0026; H05K 1/00; H05K 9/0022; H05K 2201/10; H05K 2201/10007; H05K 2201/1003
USPC ......... 361/268, 603, 620, 623, 663, 748, 760, 361/761, 763, 764, 765, 782, 783; 336/200, 336/212

See application file for complete search history.

(56) References Cited

U.S. PATENT DOCUMENTS

| | | | |
|---|---|---|---|
| 7,289,329 B2* | 10/2007 | Chen et al. ................. | 361/707 |
| 2010/0182206 A1* | 7/2010 | Barbieri et al. ............. | 343/702 |

FOREIGN PATENT DOCUMENTS

| | | |
|---|---|---|
| CN | 2932839 | 8/2007 |
| CN | 101447877 | 6/2009 |

*Primary Examiner* — Hoa C Nguyen
*Assistant Examiner* — Binh Tran
(74) *Attorney, Agent, or Firm* — Kirton McConkie; Evan R. Witt

(57) ABSTRACT

A network communication device is disclosed. The network communication device includes a circuit board, a network connector, a network chip and a plurality of network magnetic assemblies. The network connector, the network chip and the network magnetic assemblies are disposed on the circuit board. The network magnetic assemblies are electrically connected with the network connector and the network chip, respectively. Each of the network magnetic assemblies includes an Ethernet transformer and at least one inductor. The Ethernet transformer is electrically connected in series with the inductor via a conductive trace of the circuit board. The spaced distance or a path length of the conductive trace between the Ethernet transformer and the inductor of the at least one network magnetic assembly is less than a first specific length.

17 Claims, 23 Drawing Sheets

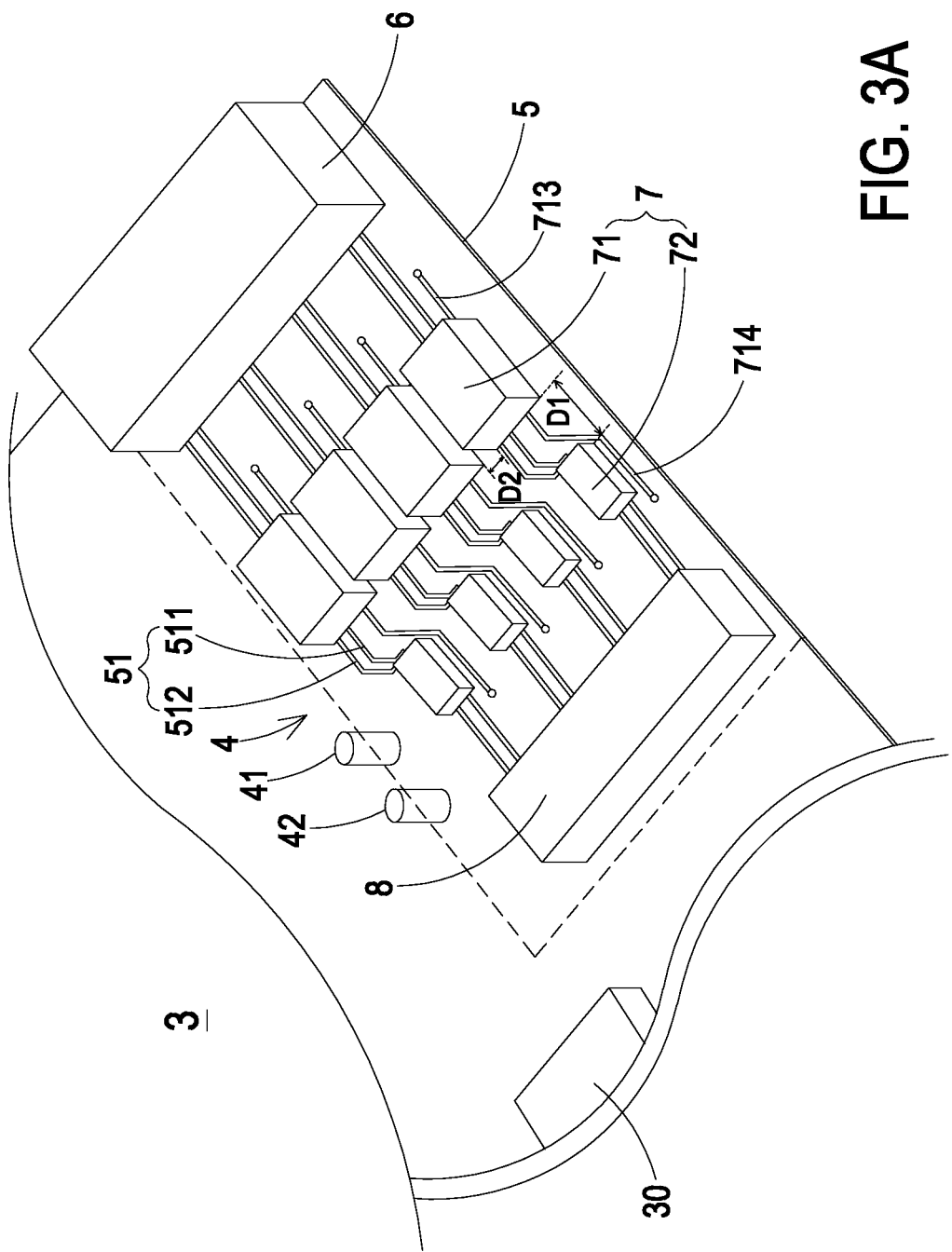

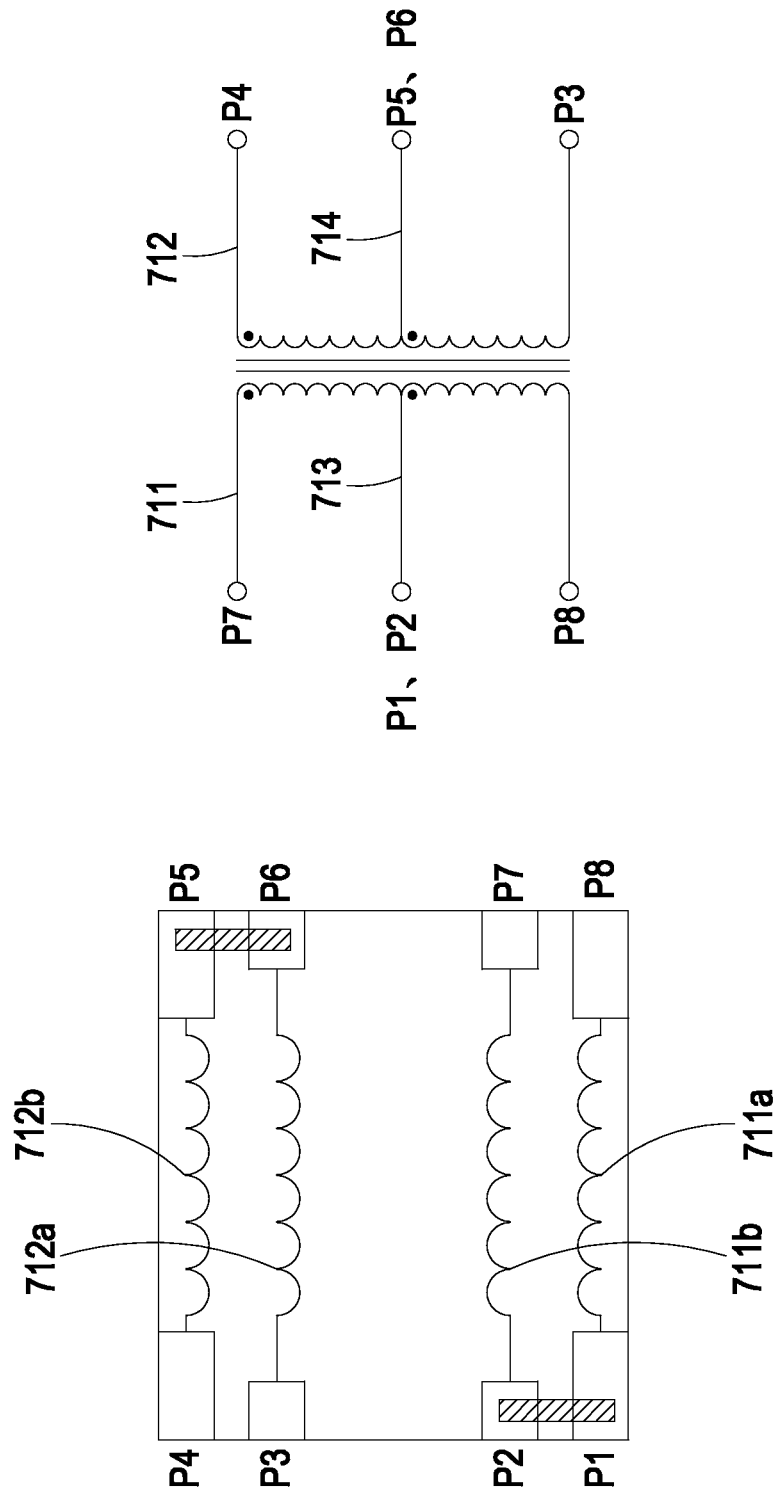

NETWORK COMMUNICATION DEVICE

CROSS-REFERENCE TO RELATED APPLICATION

This application claims the benefit of U.S. Provisional Application No. 61/668,461 filed on Jul. 6, 2012, and entitled "CIRCUIT STRUCTURE FOR COUPLING TO AN ETHERNET CONNECTOR", the entirety of which is hereby incorporated by reference.

FIELD OF THE INVENTION

The present invention relates to a network communication device, and more particularly to a network communication device capable of suppressing and reducing the electromagnetic interference (EMI).

BACKGROUND OF THE INVENTION

With the progress of computer technologies, techniques of the network communication develop vigorously. In general, terminal equipments with the network connection function, such as desktop computers, notebooks, servers, network communicational apparatuses, network switches, network connection displays, network card, and so on, have a network communication device. Therefore, the terminal equipment can communicate with other terminal equipments linking to the network by the internet through the network communication device and a network cable.

FIG. 1 is a circuit block diagram of a network communication device of the terminal equipment; and FIG. 2 is a schematic view showing a network magnetic module of the network communication device of FIG. 1. As shown in FIGS. 1 and 2, the terminal equipment 1 includes a network communication device 2, and the network communication device 2 includes a network connector 21 (i.e. Ethernet connector), a network magnetic module 22 (i.e. Ethernet transformer), and a network chip 23. The network connector is a RJ45 connector, and the network chip 23 is a Physical Layer Integrated Circuit (PHY IC). The network magnetic module 22 is electrically connected with the network connector 21 and the network chip 23, and the network magnetic module 22 is configured to perform the isolation and coupling of the signals between the external network and the network chip 23, and configured to perform the functions such as impedance match, signal shaping, common mode noise reducing and EMI reducing, and so on.

The network magnetic module 22 includes a casing 221, a plurality of ring-shaped transformers 222, and a plurality of ring-shaped filters 223. The casing 221 has an accommodation space 224, and a plurality of conductive pins 225 are extended outwardly from two exterior surfaces of the two opposite sides of the casing 221, respectively. The ring-shaped transformers 222 and the ring-shaped filters 223 are commonly disposed in the accommodation space 224 of the casing 221, and sealed in the casing 221 to form the network magnetic module 22. In the network magnetic module 22, each ring-shaped transformer 222 is electrically connected in series with a corresponding ring-shaped filter 223 via a plurality of winding coils, and each assembly of the ring-shaped transformer 222 and the ring-shaped filter 223 is connected to the conductive pins 225 on the two opposite sides of the casing 221 through two opposite ends of the winding coils. Consequently, a ring-shaped transformer 222 and a corresponding ring-shaped filter 223 can define a signal transmission channel.

Since the ring-shaped transformers 222 and the ring-shaped filters 223 of the conventional network magnetic module 22 are commonly disposed in the accommodation space 224 of the casing 221, and since the connection of the ring-shaped transformer 222 and the ring-shaped filter 223 are performed by using jump interconnection wires to couple the winding coils of the ring-shaped transformer 222 and the ring-shaped filter 223, the length of the interconnection wire between the ring-shaped transformer 222 and the ring-shaped filter 223, the distances between the interconnection wires, and the distances between the coils are quite close and can't be controlled and maintained in constant lengths. Consequently, the network communication device 2 is suffered from electromagnetic interferences when the network communication device 2 is operated. In addition, in the conventional network magnetic module 22, the signal transmission channels, which are defined by the ring-shaped transformers 222 and the ring-shaped filters 223, are integrated into a single module, and the ring-shaped transformers 222 and the ring-shaped filters 223 can't be separated from the casing 22. When the network magnetic module 22 is disposed on the circuit board, the network magnetic module 22 occupies more complete regions and spaces of the circuit board. Consequently, the layout and the arrangements of circuits, traces and electronic elements and the utilizations of the space on the circuit board are restricted. In addition, the miniaturizations of the products don't come easy.

SUMMARY OF THE INVENTION

It is an object of the present invention to provide a network communication device, which can effectively suppress or reduce the electromagnetic interference. By using the inventive network communication device, the layout and the arrangements of circuits, traces and electronic elements and the utilizations of the space on the circuit board are more convenient and flexible. In addition, the miniaturizations of the products are easy to be achieved.

According to one aspect of the present invention, a network communication device is disclosed. The network communication device includes a circuit board, a network connector, a network chip and a plurality of network magnetic assemblies. The network connector, the network chip and the network magnetic assemblies are disposed on the circuit board. The network magnetic assemblies are electrically connected with the network connector and the network chip, respectively. Each of the network magnetic assemblies includes an Ethernet transformer and at least one inductor. The Ethernet transformer is electrically connected in series with the inductor via a conductive trace of the circuit board. The spaced distance or the path length of the conductive trace between the Ethernet transformer and the inductor of the at least one network magnetic assembly is less than a first specific length.

According to another aspect of the present invention, a network communication device is disclosed. The network communication device includes a circuit board, a network connector, a network chip and at least one signal transmission channel. The signal transmission channel is electrically connected with the network connector and the network chip. The signal transmission channel includes an Ethernet transformer and an inductor. The Ethernet transformer and the inductor are single modules, respectively, and disposed on the circuit board. The Ethernet transformer is electrically connected in series with the inductor via a conductive trace of the circuit board. The spaced distance or the path length of the conductive trace between the Ethernet transformer and the inductor is less than a first specific length.

The above contents of the present invention will become more readily apparent to those ordinarily skilled in the art after reviewing the following detailed description and accompanying drawings, in which:

BRIEF DESCRIPTION OF THE DRAWINGS

FIG. 3A is a schematic view of a network communication device according to one preferred embodiment of the present invention;

FIG. 6B is a view showing the arrangements of the winding coils and contact pins of the Ethernet transformer, which is in connection with the circuit board of FIG. 6A;

FIG. 6C is a circuit diagram showing an equivalent circuit to the Ethernet transformer, which is in connection with the circuit board of FIG. 6A;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
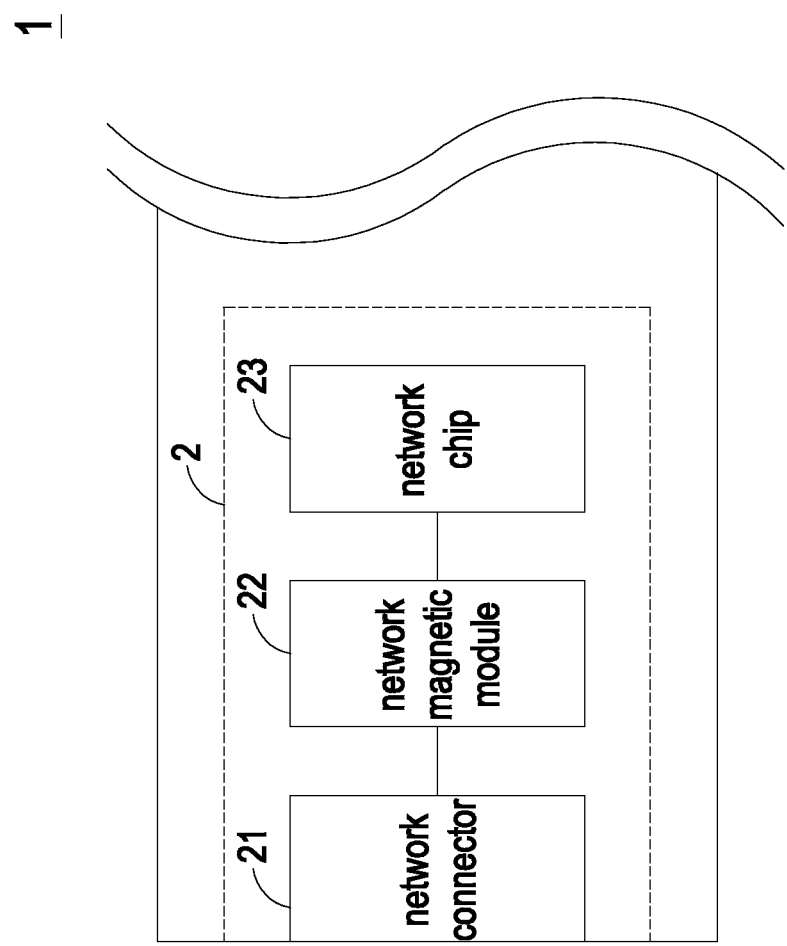
FIG. 1 is a circuit block diagram of a network communication device of the terminal equipment.
Figure 2:
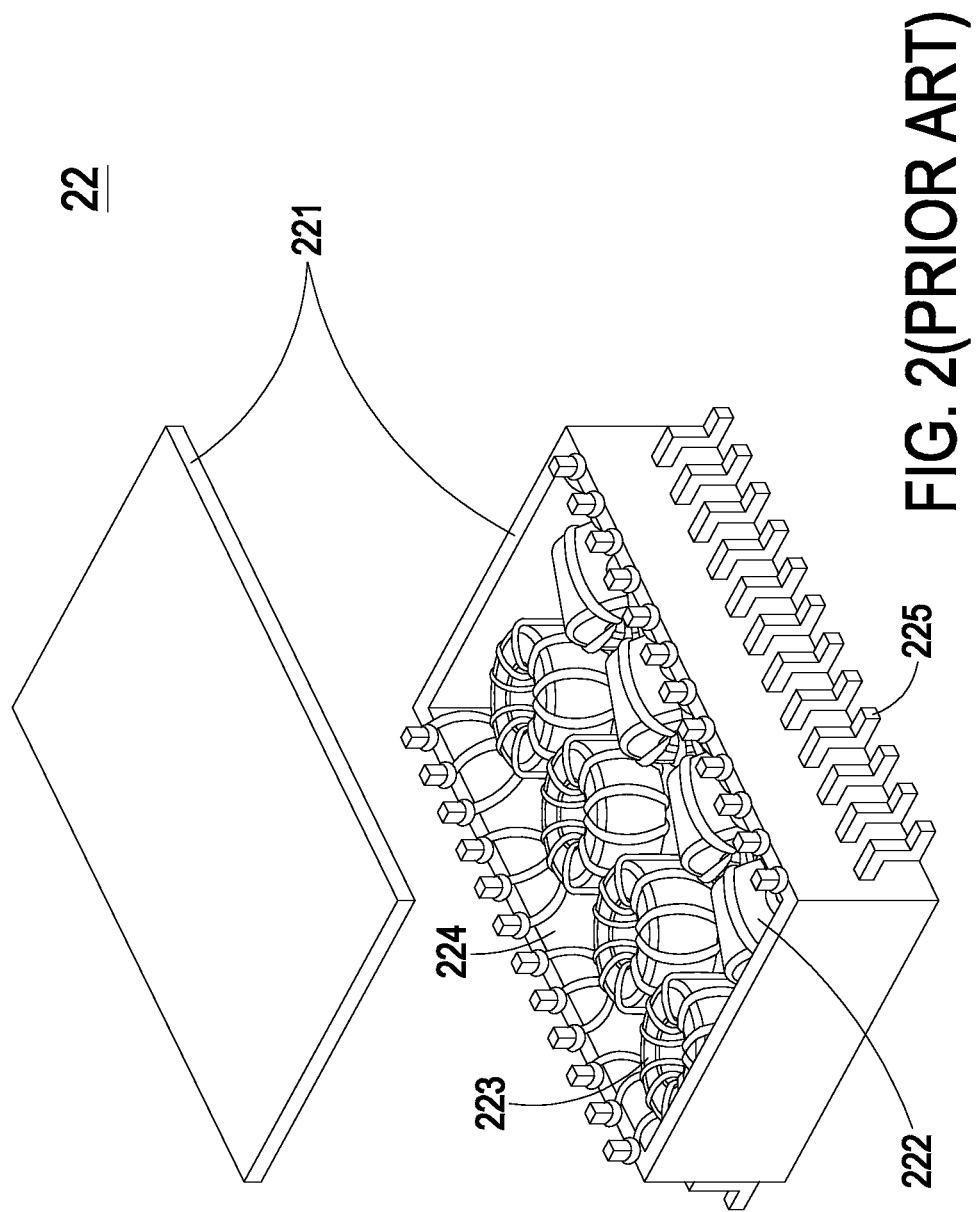
FIG. 2 is a schematic view showing a network magnetic module of the network communication device of FIG. 1.
Figure 3B:
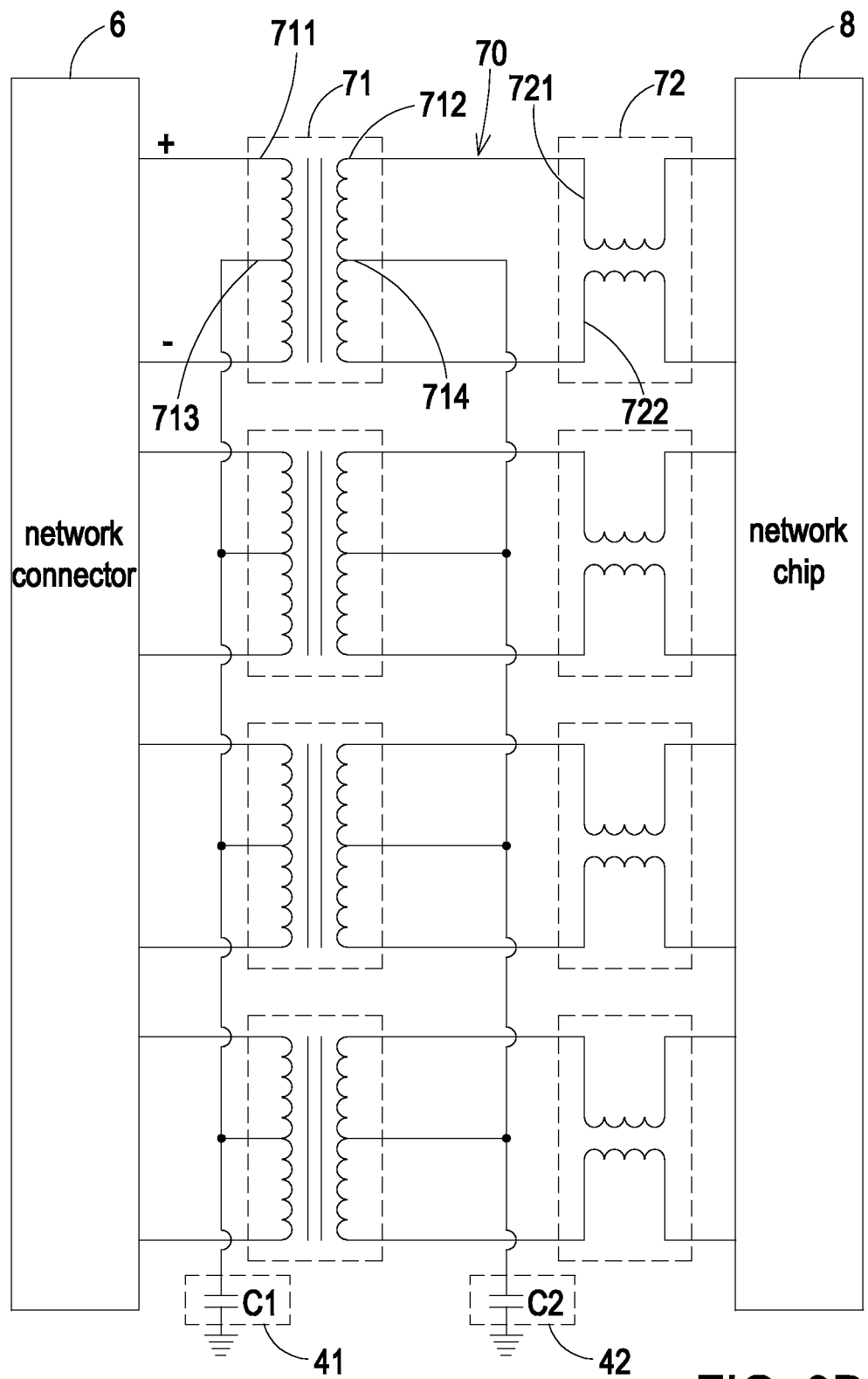
FIG. 3B is a circuit diagram showing an equivalent circuit to the network communication device of FIG. 3A.

Please refer to FIGS. 3A and 3B. FIG. 3A is a schematic view of a network communication device according to one preferred embodiment of the present invention; and FIG. 3B is a circuit diagram showing an equivalent circuit to the network communication device of FIG. 3A. The network communication device 4 is applied in a terminal equipment 3 with the network connection function. The terminal equipment 3 includes, but not limited to, a desktop computer, a notebook, a server, a network communicational apparatus, a network switch, a network connection display, a network card. The terminal equipment 3 can communicate with other terminal equipments linking to the network by the internet through the network communication device 4 and a network cable. The network communication device 4 includes a circuit board 5, at least one network connector 6, a plurality of network magnetic assemblies 7, and a network chip 8. The network connector 6, the network magnetic assemblies 7 and the network chip 8 are disposed on the circuit board 5. The network connector 6 is a RJ45 connector, and the network chip 8 is a Physical Layer Integrated Circuit (PHY IC). The network magnetic assemblies 7 include a plurality of Ethernet transformers 71 and a plurality of inductors 72 (i.e. choke). Preferably, the inductor 72 is a common mode choke. Each of the network magnetic assemblies 7 includes an Ethernet transformer 71 and at least one inductor 72. The network magnetic assemblies 7 are electrically connected with the network connector 6 and the network chip 8, respectively, by using the electrodes at the two opposite sides of the network magnetic assemblies 7. The network magnetic assemblies 7 are configured to perform the isolation and coupling of the signals between the external network and the network chip 8, and configured to perform the functions such as impedance match, signal shaping, common mode noise reducing and EMI reducing, and so on. The terminal equipment 3 further includes a system unit 30 electrically connected with the network chip 8 for processing the internal information signals of the terminal equipment 3. The internal information signals of the terminal equipment 3 may include the digital signals processed by a CPU or the information signals of processing the web-pages. The terminal equipment 3 can selectively transmit the internal information signals to other terminal equipment or communicate with other terminal equipment, which is linking to the terminal equipment 3 by the internet, through the network communication device 4 and a network cable.

In an embodiment, the network communication device 4 includes at least four network magnetic assemblies 7. Namely, the network communication device 4 includes at least four Ethernet transformers 71 and at least four inductors 72. The Ethernet transformer 71 and the inductor 72 of each network magnetic assembly 7 are respectively single modules and separated with each other. Preferably, the Ethernet transformer 71 is a surface mount transformer or a chip transformer, and the inductor 72 is a surface mount inductor or a chip inductor. In each network magnetic assembly 7, the Ethernet transformer 71 is electrically connected in series with the inductor 72 via a conductive trace 51 of the circuit board 5 so as to form a signal transmission channel 70. Namely, the network communication device 4 includes four signal transmission channels 70. All of the four signal transmission channels 70 are employed for transmitting the Ethernet physical layer signals (i.e. network signals). In each network magnetic assembly 7, the spaced distance between the Ethernet transformer 71 and the inductor 72 or the path length of the conductive trace 51 between the Ethernet transformer 71 and the inductor 72 is less than a first specific length D1. The spaced distance between the Ethernet transformer 71 and the inductor 72 is defined as the longitudinal distance between two faced side surfaces of the Ethernet transformer 71 and the inductor 72. The path length of the conductive trace 51 is defined as a layout length of the conductive trace 51 from a contact pin of the Ethernet transformer 71 to a corresponding contact pin of the inductor 72. Preferably, the first specific length D1 is about 1 mm. The Ethernet transformers 71 and the inductors 72 can be disposed on the circuit board 5 in various arrangements according to the practice requirements. The layout of the conductive traces 51 can be varied according to the practice requirements. Preferably, the path lengths of the conductive traces 51 of the signal transmission channels 70 are substantially the same. Similarly, the path lengths of the conductive traces between the Ethernet transformers 71 and the network connector 6 are substantially the same. The path lengths of the conductive traces between the inductors 72 and the network chip 8 are substantially the same. Preferably, the spaced distances between any two adjacent signal transmission channels 70 are substantially the same.

The conductive trace 51 of the circuit board 5 includes a first conductive line 511 and a second conductive line 512. The first conductive line 511 is substantially in parallel with the second conductive line 512. Namely, the gap between first conductive line 511 and the second conductive line 512 is substantially maintained at a constant distance. In an embodiment, the Ethernet transformers 71 are disposed on the circuit board 5, and the Ethernet transformers 71 are arranged in a first line with a gap having a second specific length D2 between any two adjacent Ethernet transformers 71. The gap is defined as a spaced horizontal distance between two adjacent Ethernet transformers 71. Preferably, the second specific length D2 is ranged from about 0.5 mm to 1.35 mm. The inductors 72 are disposed on the circuit board 5, and the inductors 72 are arranged in a second line in parallel with the first line. It is noted that the arrangements of the Ethernet transformers 71 and the inductors 72 on the circuit board 5 are not limited to the embodiment as shown in FIG. 3A. The arrangements of the Ethernet transformers 71 and the inductors 72 on the circuit board 5 can be varied according to the practice requirements and the available space of the circuit board 5. Preferably, the Ethernet transformer 71 is a surface mount transformer or a chip transformer, and the inductor 72 is a surface mount inductor or a chip inductor.

In an embodiment, as shown in FIGS. 3A and 3B, each network magnetic assembly 7 includes an Ethernet transformer 71 and an inductor 72. The inductor 72 is electrically connected with and between the Ethernet transformer 71 and the network chip 8. In each network magnetic assembly 7, the Ethernet transformer 71 includes at least one primary winding set 711 and at least one secondary winding set 712. Two ends (i.e. positive terminal and negative terminal) of the primary winding set 711 are electrically connected with the network connector 6, and two ends (i.e. positive terminal and negative terminal) of the secondary winding set 712 are electrically connected with the network chip 8. The primary winding set 711 and the secondary winding set 712 of the Ethernet transformer 71 have central lines 713, 714, respectively. The inductor 72 includes a first winding coil 721 and a second winding coil 722. Two ends of the first winding coil 721 are electrically connected to one end of the secondary winding set 712 of the Ethernet transformer 71 and the network chip 8, respectively. Two ends of the second winding coil 722 are electrically connected to the other end of the secondary winding set 712 of the Ethernet transformer 71 and the network chip 8, respectively. The Ethernet physical layer signals transmitted from the network connector 6 to the network chip 8 or transmitted from the network chip 8 to the network connector 6 will pass through the Ethernet transformers 71 and the inductors 72. The Ethernet transformers 71 are configured to perform the isolation and coupling of the signals, and the inductors 72 are configured to filter the high-frequency portion of the signals and suppress or reduce the common mode noise and EMI.

The network communication device 4 further includes a first protection unit 41 electrically connected with and between a ground terminal and the central line 713, and/or a second protection unit 42 electrically connected with and between a ground terminal and the central line 714. The first protection unit 41 and the second protection unit 42 are employed for balancing the electric potentials of the positive terminals and negative terminals of the primary winding set 711 and the secondary winding set 712 of the Ethernet transformer 71 and suppressing and reducing the common mode noise and EMI. In addition, when a power surge at high voltage level is introduced into the terminal equipment 3 via the network connector 6, the first protection unit 41 and the second protection unit 42 can be used to absorb the energy of the power surge and protect other electronic devices from being damaged. In an embodiment, the first protection unit 41 and the second protection unit 42 include a capacitor C1 and a capacitor C2, respectively, but it is not limited thereto.

Figure 4A:
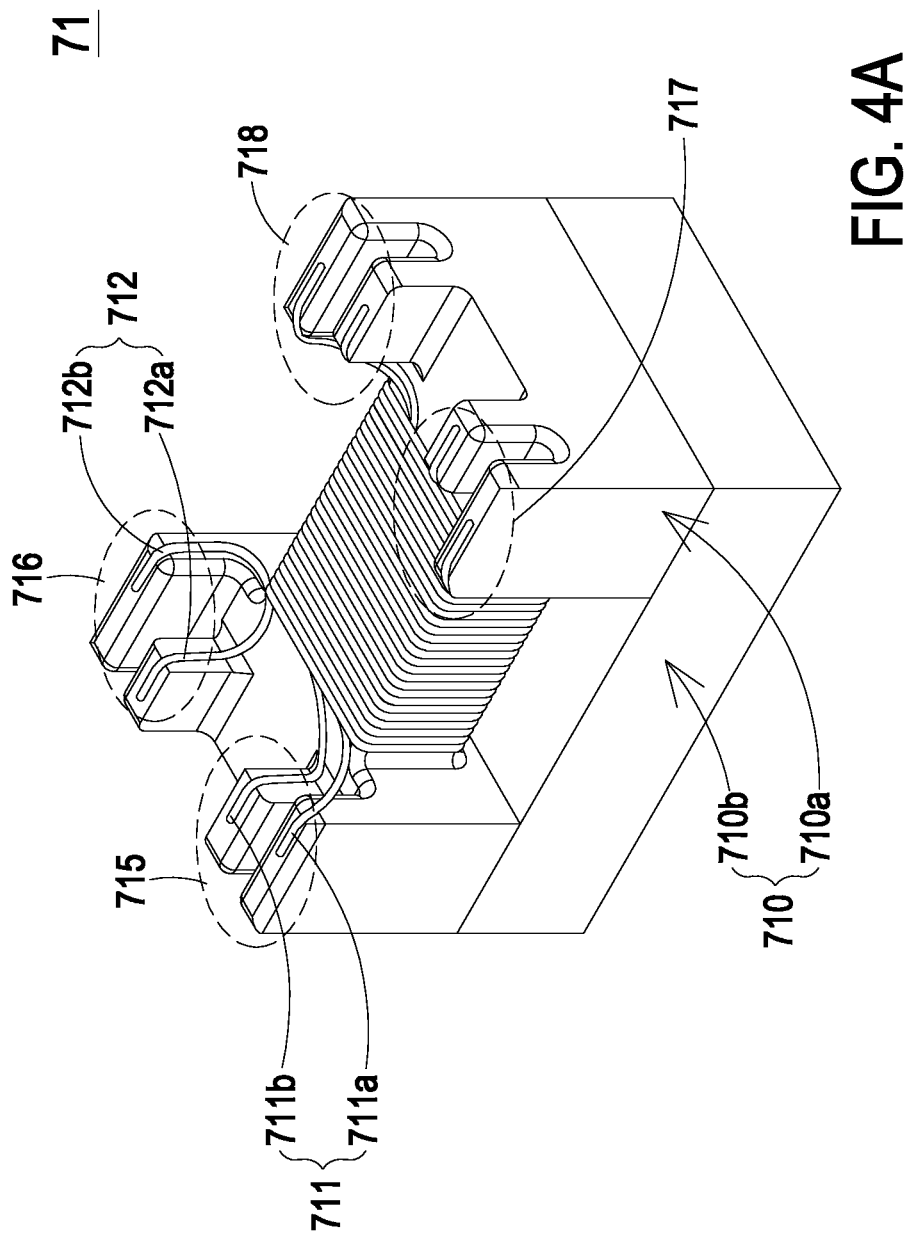
FIG. 4A is a schematic view of an Ethernet transformer of FIG. 3A.
Figures 4B, 4C:
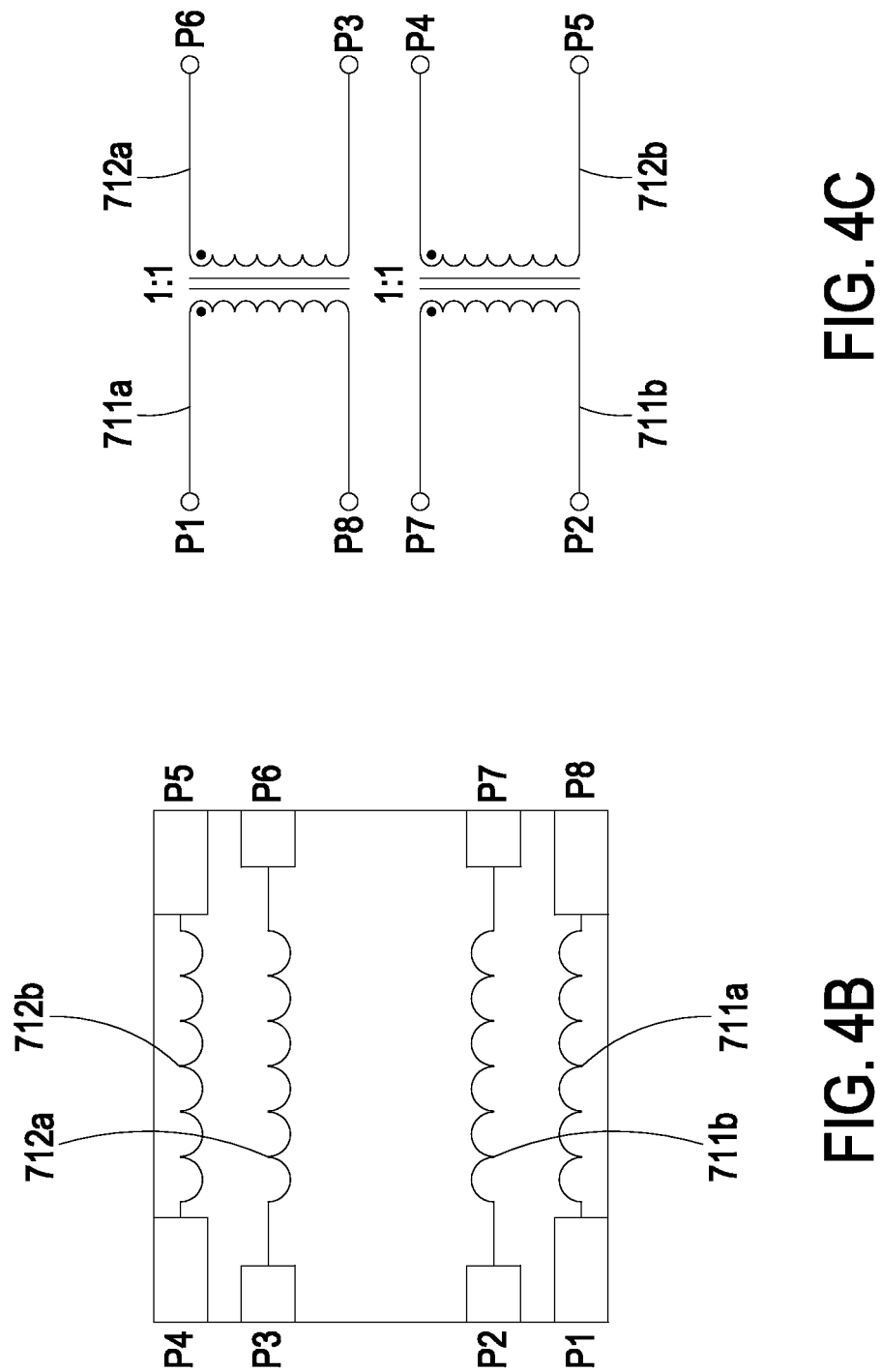
FIG. 4B is a view showing the arrangements of the winding coils and contact pins of the Ethernet transformer of FIG. 4A.
FIG. 4C is a circuit diagram showing an equivalent circuit to the Ethernet transformer of FIG. 4A.

Please refer to FIGS. 4A, 4B, and 4C. FIG. 4A is a schematic view of an Ethernet transformer of FIG. 3A; FIG. 4B is a view showing the arrangements of the winding coils and contact pins of the Ethernet transformer of FIG. 4A; and FIG. 4C is a circuit diagram showing an equivalent circuit to the Ethernet transformer of FIG. 4A. The Ethernet transformer 71 includes a magnetic core assembly 710, at least one primary winding set 711 and at least one secondary winding set 712. The magnetic core assembly 710 includes a first magnet core 710a and a second magnet core 710b. Preferably, the first magnet core 710a is a drum-shaped magnet core, and the second magnet core 710b is a plate-shaped magnet core, but it is not limited thereto. The first magnet core 710a includes a plurality of contact pin sets 715, 716, 717 and 718. The contact pin sets 715 and 716 are located at the same side of the first magnet core 710a, and the contact pin sets 717 and 718 are located at the other side of the first magnet core 710a and corresponding to the contact pin sets 715 and 716, respectively. In an embodiment, the each contact pin set includes two contact pins, but it is not limited thereto. For illustrating the embodiment conveniently, the plural contact pins of the Ethernet transformer 71 are numbered as P1~P8. The contact pin set 715 includes contact pins P1 and P2, the contact pin set 716 includes contact pins P3 and P4, the contact pin set 718 includes contact pins P5 and P6, and the contact pin set 717 includes contact pins P7 and P8.

The primary winding set 711 and the secondary winding set 712 are wound around the first magnet core 710a. The primary winding set 711 is electrically connected with the contact pin sets 715 and 717 of the first magnet core 710a, and the secondary winding set 712 is electrically connected with the contact pin sets 716 and 718 of the first magnet core 710a. The primary winding set 711 and the secondary winding set 712 are used to perform electromagnet coupling with the magnetic core assembly 710. In this embodiment, the primary winding set 711 includes a first primary winding coil 711a and a second primary winding coil 711b. The first primary winding coil 711a is electrically connected with the contact pin P1 of the contact pin set 715 and the contact pin P8 of the contact pin set 717. The second primary winding coil 711b is electrically connected with the contact pin P2 of the contact pin set 715 and the contact pin P7 of the contact pin set 717. Similarly, the secondary winding set 712 includes a first secondary winding coil 712a and a second secondary winding coil 712b. The first secondary winding coil 712a is electrically connected with the contact pin P3 of the contact pin set 716 and the contact pin P6 of the contact pin set 718. The second secondary winding coil 712b is electrically connected with the contact pin P4 of the contact pin set 716 and the contact pin P5 of the contact pin set 718. In some embodiment, the winding directions of the primary winding set 711 and the secondary winding set 712 are different with each other.

Figure 5B:
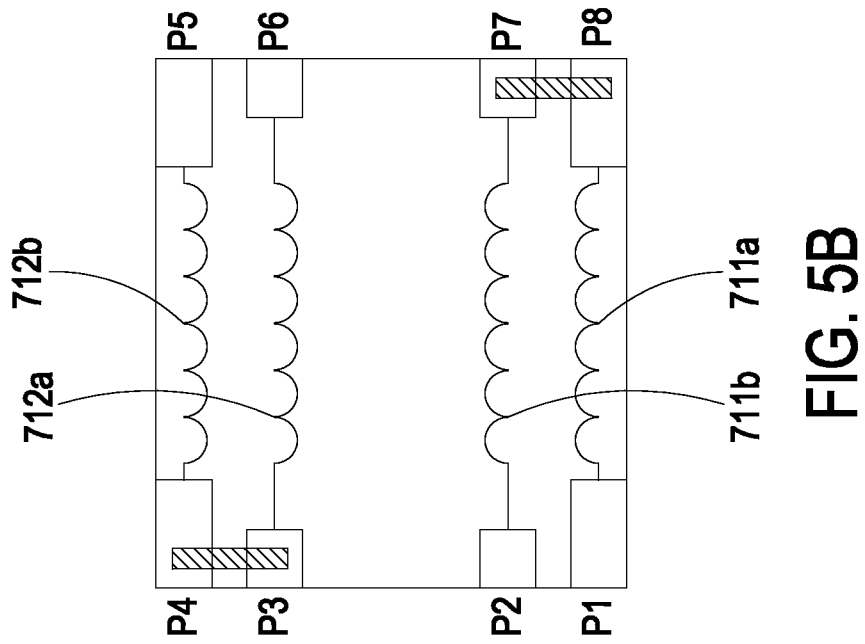
FIG. 5B is a view showing the arrangements of the winding coils and contact pins of the Ethernet transformer, which is in connection with the circuit board of FIG. 5A.
Figure 5A:
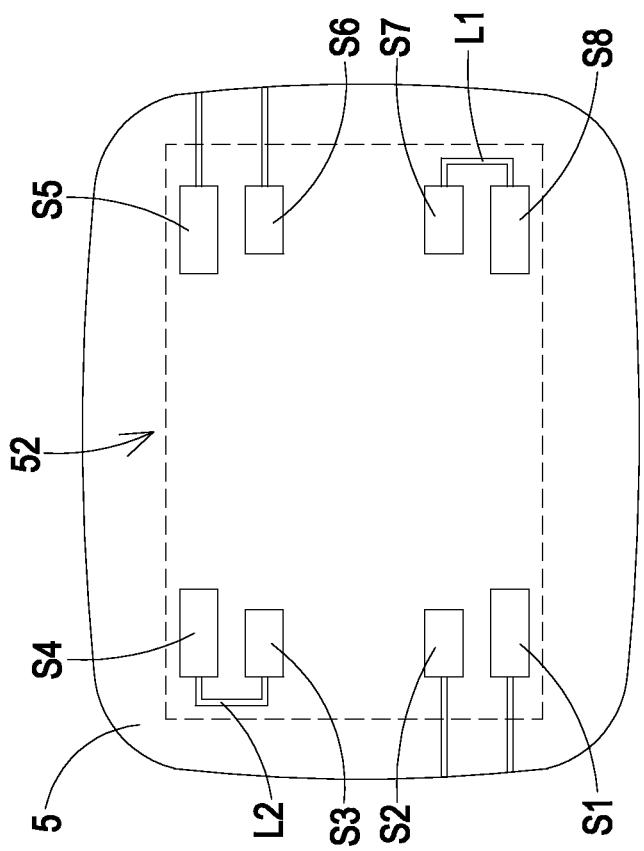
FIG. 5A is a schematic view showing a solder area of the circuit board corresponding to the Ethernet transformer of FIG. 4A.
Figure 5C:
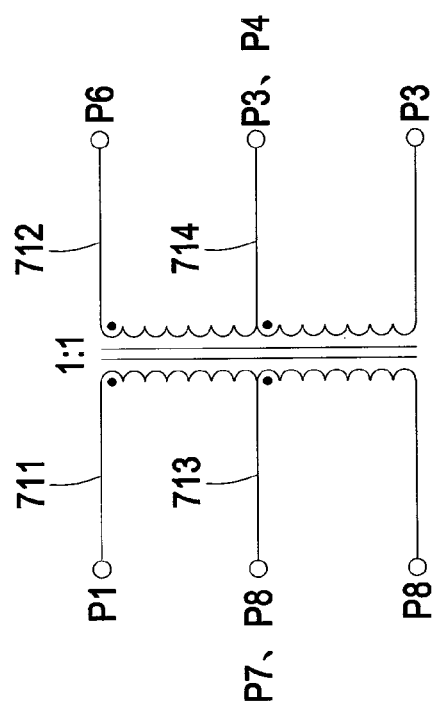
FIG. 5C is a circuit diagram showing an equivalent circuit to the Ethernet transformer, which is in connection with the circuit board of FIG. 5A.

Please refer to FIGS. 5A, 5B, and 5C. FIG. 5A is a schematic view showing a solder area of the circuit board corresponding to the Ethernet transformer of FIG. 4A; FIG. 5B is a view showing the arrangements of the winding coils and contact pins of the Ethernet transformer, which is in connection with the circuit board of FIG. 5A; and FIG. 5C is a circuit diagram showing an equivalent circuit to the Ethernet transformer, which is in connection with the circuit board of FIG. 5A. The solder area 52 of the circuit board 5 includes a plurality of solder pads S1~S8 for connecting with corresponding contact pins P1~P8 of the Ethernet transformer 71. The solder area 52 further includes a first connection line L1 and a second connection line L2. The first connection line L1 is connected with the solder pads S7 and S8, and the second connection line L2 is connected with the solder pads S3 and S4. Consequently, when the Ethernet transformer 71 is disposed on the circuit board 5, the first connection line L1 is electrically connected with the contact pins P7 and P8 of the Ethernet transformer 71 so as to form a central line 713 of the primary winding set 711 of the Ethernet transformer 71. In addition, the second connection line L2 is electrically connected with the contact pins P3 and P4 of the Ethernet transformer 71 so as to form a central line 714 of the secondary winding set 712 of the Ethernet transformer 71.

Figure 6A:
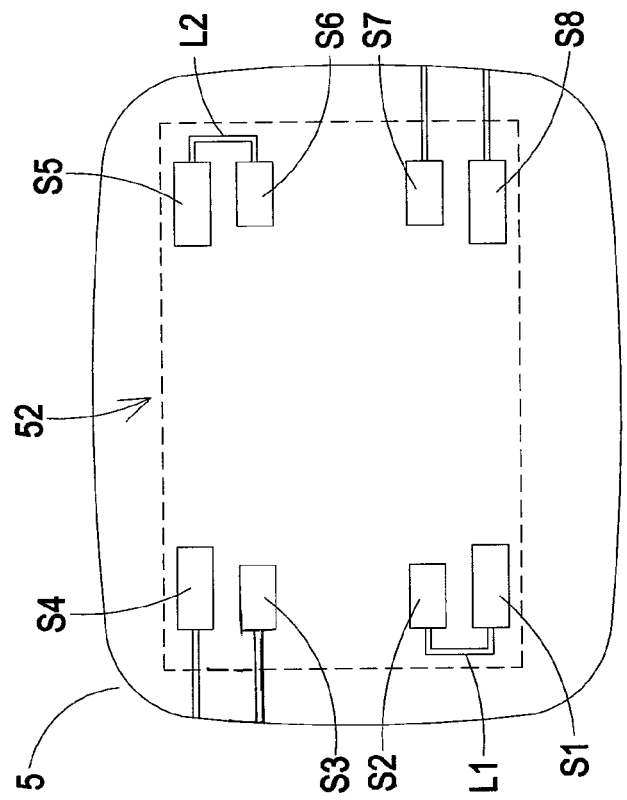
FIG. 6A is a schematic view showing another solder area of the circuit board corresponding to the Ethernet transformer of FIG. 4A.

Please refer to FIGS. 6A, 6B, and 6C. FIG. 6A is a schematic view showing another solder area of the circuit board corresponding to the Ethernet transformer of FIG. 4A; FIG. 6B is a view showing the arrangements of the winding coils and contact pins of the Ethernet transformer, which is in connection with the circuit board of FIG. 6A; and FIG. 6C is a circuit diagram showing an equivalent circuit to the Ethernet transformer, which is in connection with the circuit board of FIG. 6A. The solder area 52 of the circuit board 5 includes a plurality of solder pads S1~S8 for connecting with corresponding contact pins P1~P8 of the Ethernet transformer 71. The solder area 52 further includes a first connection line L1 and a second connection line L2. The first connection line L1 is connected with the solder pads S1 and S2, and the second connection line L2 is connected with the solder pads S5 and S6. Consequently, when the Ethernet transformer 71 is disposed on the circuit board 5, the first connection line L1 is electrically connected with the contact pins P1 and P2 of the Ethernet transformer 71 so as to form a central line 713 of the primary winding set 711 of the Ethernet transformer 71. In addition, the second connection line L2 is electrically connected with the contact pins P5 and P6 of the Ethernet transformer 71 so as to form a central line 714 of the secondary winding set 712 of the Ethernet transformer 71.

According to the connection structures of the Ethernet transformer 71 and the circuit board 5 as shown in FIGS. 4A~6C, the arrangements of the circuits and electronic elements of the network communication device 4 can be varied according to the practice requirements by connecting the solder pads S1~S8 of the solder area 52 of the circuit board 5 with the contact pins P1~P8 of the Ethernet transformer 71.

Figure 7A:
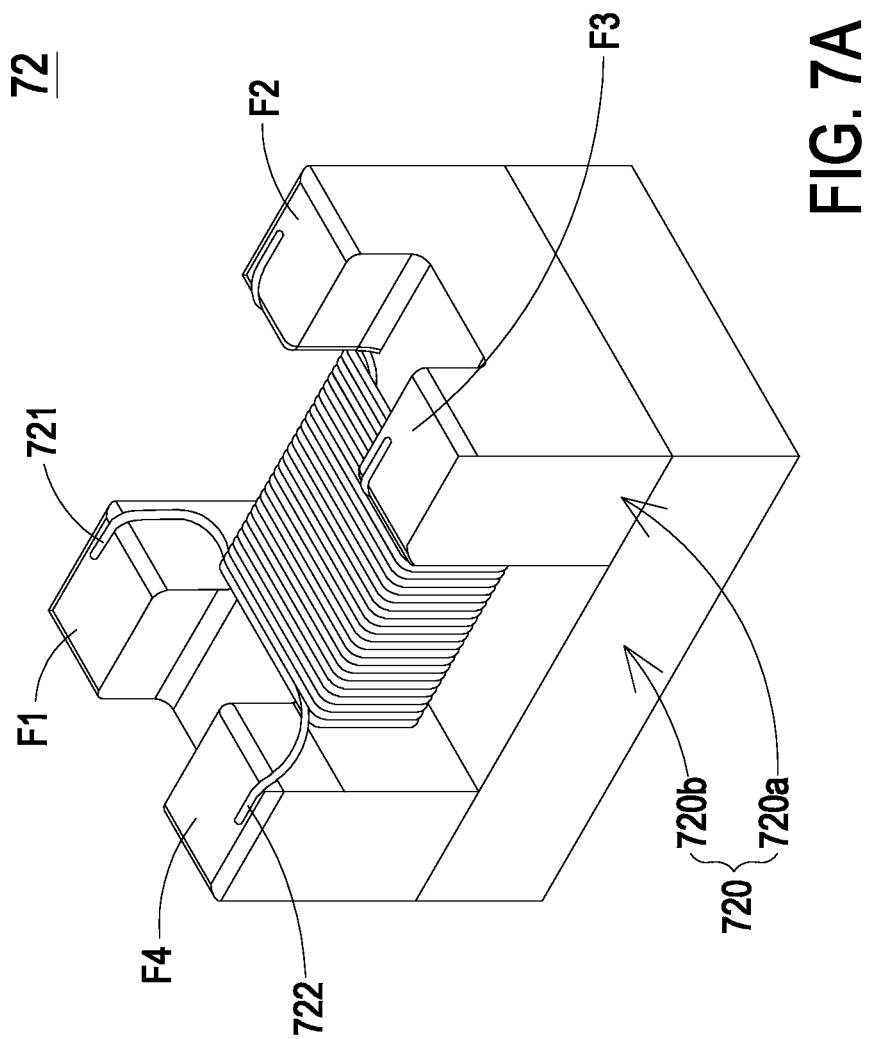
FIG. 7A is a schematic view of an inductor of FIG. 3A.
Figure 7C:
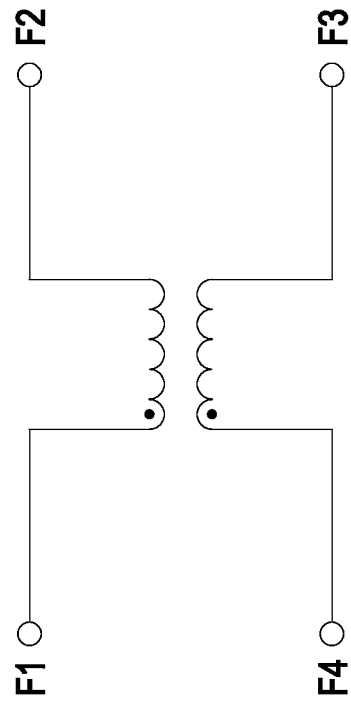
FIG. 7C is a circuit diagram showing an equivalent circuit to the inductor of FIG. 7A.
Figure 7B:
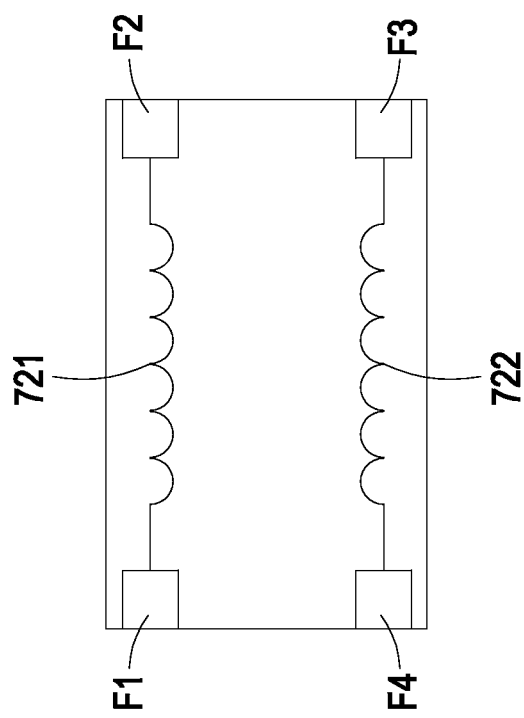
FIG. 7B is a view showing the arrangements of the winding coils and contact pins of the inductor of FIG. 7A.

FIG. 7A is a schematic view of an inductor of FIG. 3A; FIG. 7B is a view showing the arrangements of the winding coils and contact pins of the inductor of FIG. 7A; and FIG. 7C is a circuit diagram showing an equivalent circuit to the inductor of FIG. 7A. As shown in FIGS. 7A, 7B, and 7C, the inductor 72 includes a magnetic core assembly 720, a first winding coil 721 and a second winding coil 722. The magnetic core assembly 720 includes a first magnet core 720a and a second magnet core 720b. Preferably, the first magnet core 720a is a drum-shaped magnet core, and the second magnet core 720b is a plate-shaped magnet core, but it is not limited thereto. The first magnet core 720a includes a plurality of contact pins F1, F2, F3 and F4. The contact pins F1 and F4 are located at the same side of the first magnet core 720a, and the contact pins F2 and F3 are located at the other side of the first magnet core 720a and corresponding to the contact pins F1 and F4, respectively. The first winding coil 721 and the second winding coil 722 are wound around the first magnet core 720a. The first winding coil 721 is electrically connected with the contact pins F1 and F2 of the first magnet core 720a, and the second winding coil 722 is electrically connected with the contact pins F3 and F4 of the first magnet core 720a. The first winding coil 721 and the second winding coil 722 are used to perform electromagnet coupling with the magnetic core assembly 720.

Figure 8A:
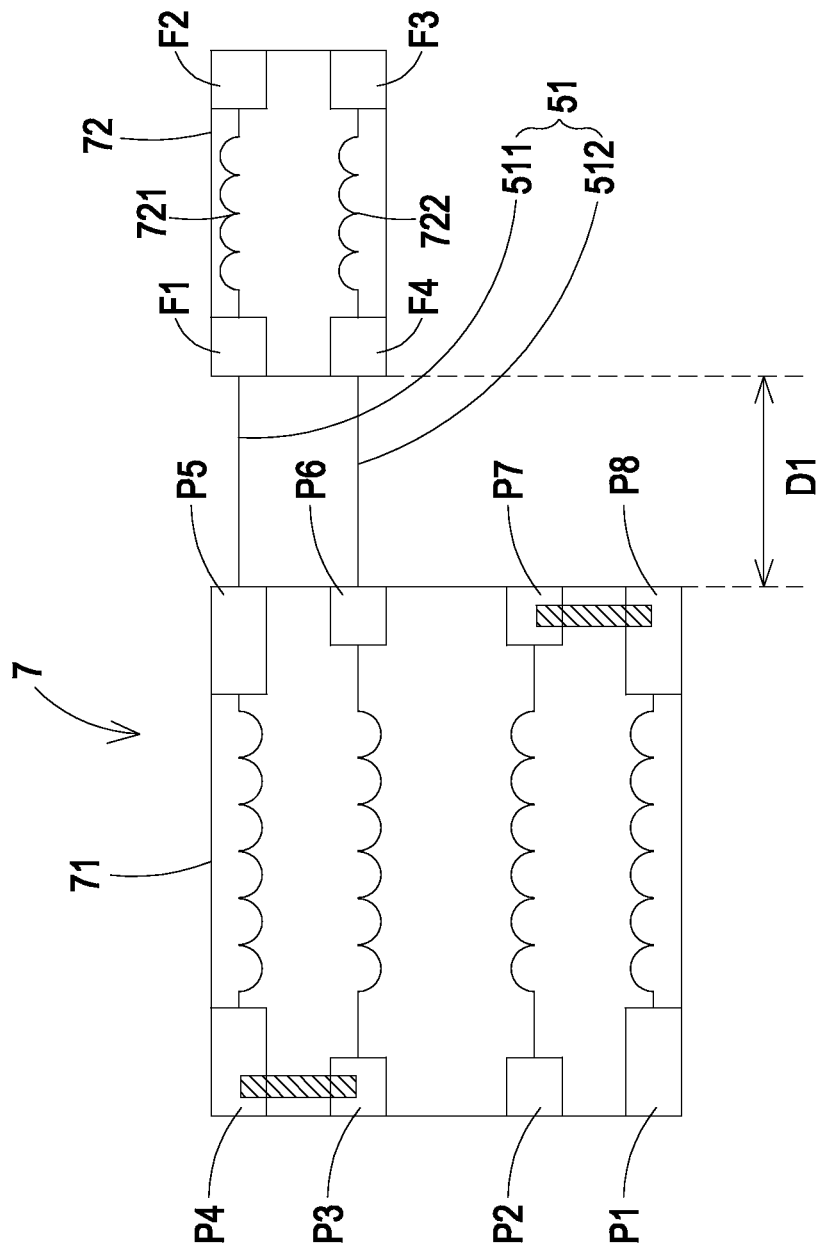
FIG. 8A is a view showing the arrangement and connection of the Ethernet transformer and the inductor to form the network magnetic assembly in a first type.

FIG. 8A is a view showing the arrangement and connection of the Ethernet transformer and the inductor to form the network magnetic assembly in a first type. As shown in FIGS. 3A, 3B, 5A, 5B, 5C and 8A, in a network magnetic assembly 7, the Ethernet transformer 71 is electrically connected in series with the inductor 72 via the conductive trace 51 of the circuit board 5. The contact pins P5 and P6 of the Ethernet transformer 71, which are connected with the two ends of the secondary winding set 712, are electrically connected with the first conductive line 511 and the second conductive line 512 of the conductive trace 51 via the solder pads S5 and S6 of the circuit board 5, respectively. The contact pins P1 and P2 of the Ethernet transformer 71, which are connected with the two ends of the primary winding set 711, are electrically connected with the network connector 6. The contact pin F1 of the inductor 72, which is connected with the first winding coil 721, is electrically connected with the first conductive line 511 of the conductive trace 51. The contact pin F4 of the inductor 72, which is connected with the second winding coil 722, is electrically connected with the second conductive line 512 of the conductive trace 51. The contact pins F2 and F3 are electrically connected with the network chip 8. Consequently, the network magnetic assembly 7 in a first type can be formed by connecting the Ethernet transformer 71 with the inductor 72 via the conductive trace 51 of the circuit board 5. The network magnetic assembly 7 in the first type can be named as A type network magnetic assembly. In this embodiment, the first conductive line 511 is substantially in parallel with the second conductive line 512. Namely, the gap between first conductive line 511 and the second conductive line 512 is substantially maintained at a constant distance from the Ethernet transformer 71 toward the inductor 72. In addition, the spaced distance between the Ethernet transformer 71 and the inductor 72 or the path length of the conductive trace 51 between the Ethernet transformer 71 and the inductor 72 is less than a first specific length D1. Preferably, the first specific length D1 is about 1 mm.

Figure 8B:
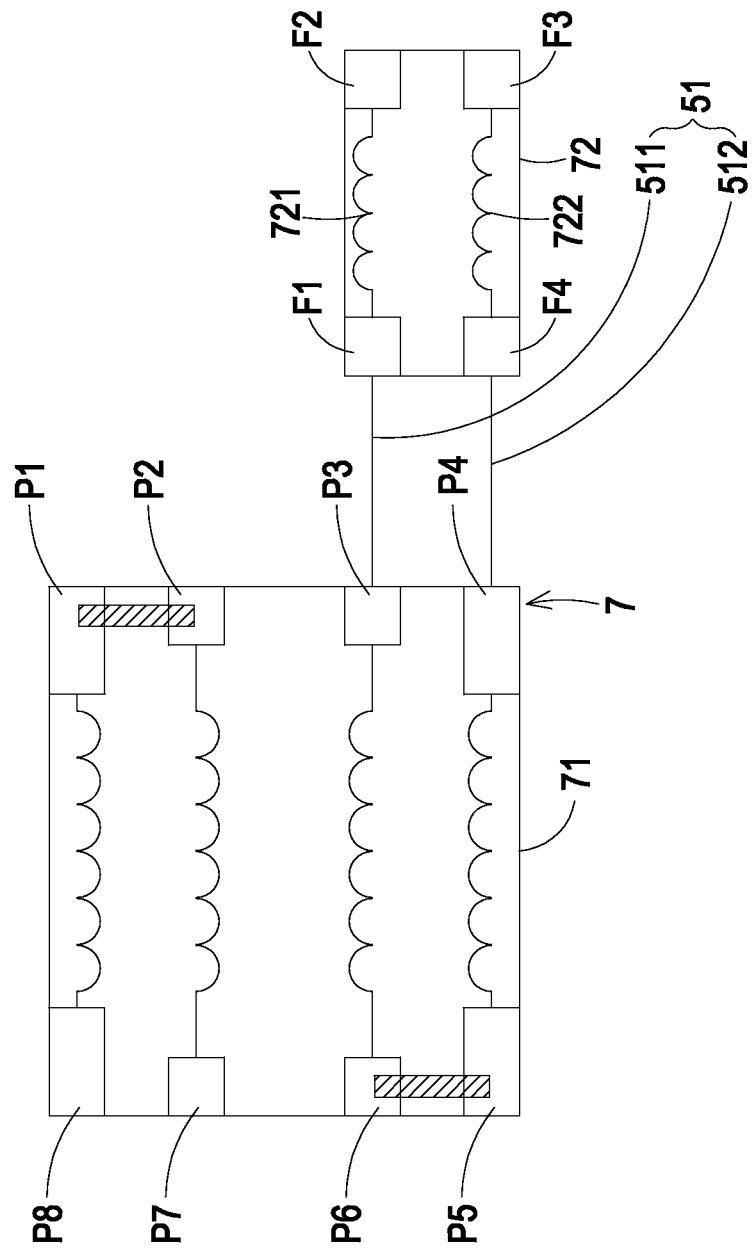
FIG. 8B is a view showing the arrangement and connection of the Ethernet transformer and the inductor to form the network magnetic assembly in a second type.

FIG. 8B is a view showing the arrangement and connection of the Ethernet transformer and the inductor to form the network magnetic assembly in a second type. As shown in FIGS. 3A, 3B, 6A, 6B, 6C and 8B, in a network magnetic assembly 7, the Ethernet transformer 71 is electrically connected in series with the inductor 72 via the conductive trace 51 of the circuit board 5. The contact pins P3 and P4 of the Ethernet transformer 71, which are connected with the two ends of the secondary winding set 712, are electrically connected with the first conductive line 511 and the second conductive line 512 of the conductive trace 51 via the solder pads S3 and S4 of the circuit board 5, respectively. The contact pins P7 and P8 of the Ethernet transformer 71, which are connected with the two ends of the primary winding set 711, are electrically connected with the network connector 6. The contact pin F1 of the inductor 72, which is connected with the first winding coil 721, is electrically connected with the first conductive line 511 of the conductive trace 51. The contact pin F4 of the inductor 72, which is connected with the second winding coil 722, is electrically connected with the second conductive line 512 of the conductive trace 51. The contact pins F2 and F3 are electrically connected with the network chip 8. Consequently, the network magnetic assembly 7 in a second type can be formed by connecting the Ethernet transformer 71 with the inductor 72 via the conductive trace 51 of the circuit board 5. The network magnetic assembly 7 in the second type can be named as B type network magnetic assembly. In this embodiment, the first conductive line 511 is substantially in parallel with the second conductive line 512. Namely, the gap between first conductive line 511 and the second conductive line 512 is substantially maintained at a constant distance from the Ethernet transformer 71 toward the inductor 72. In addition, the spaced distance between the Ethernet transformer 71 and the inductor 72 or the path length of the conductive trace 51 between the Ethernet transformer 71 and the inductor 72 is less than a first specific length D1. Preferably, the first specific length D1 is about 1 mm.

Figure 9A:
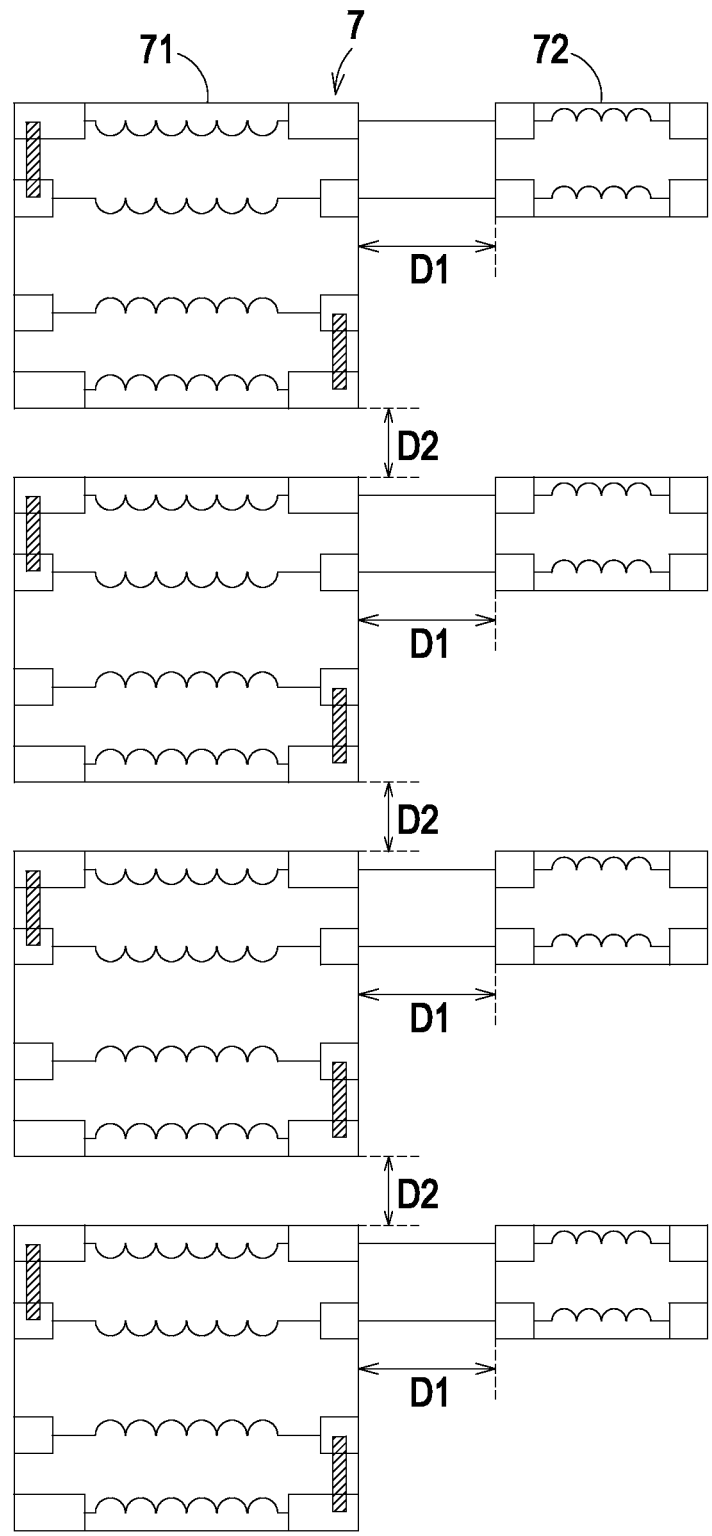
FIGS. 9A, 9B and 9C show various arrangements of the plural network magnetic assemblies disposed on the circuit board.
Figure 9B:
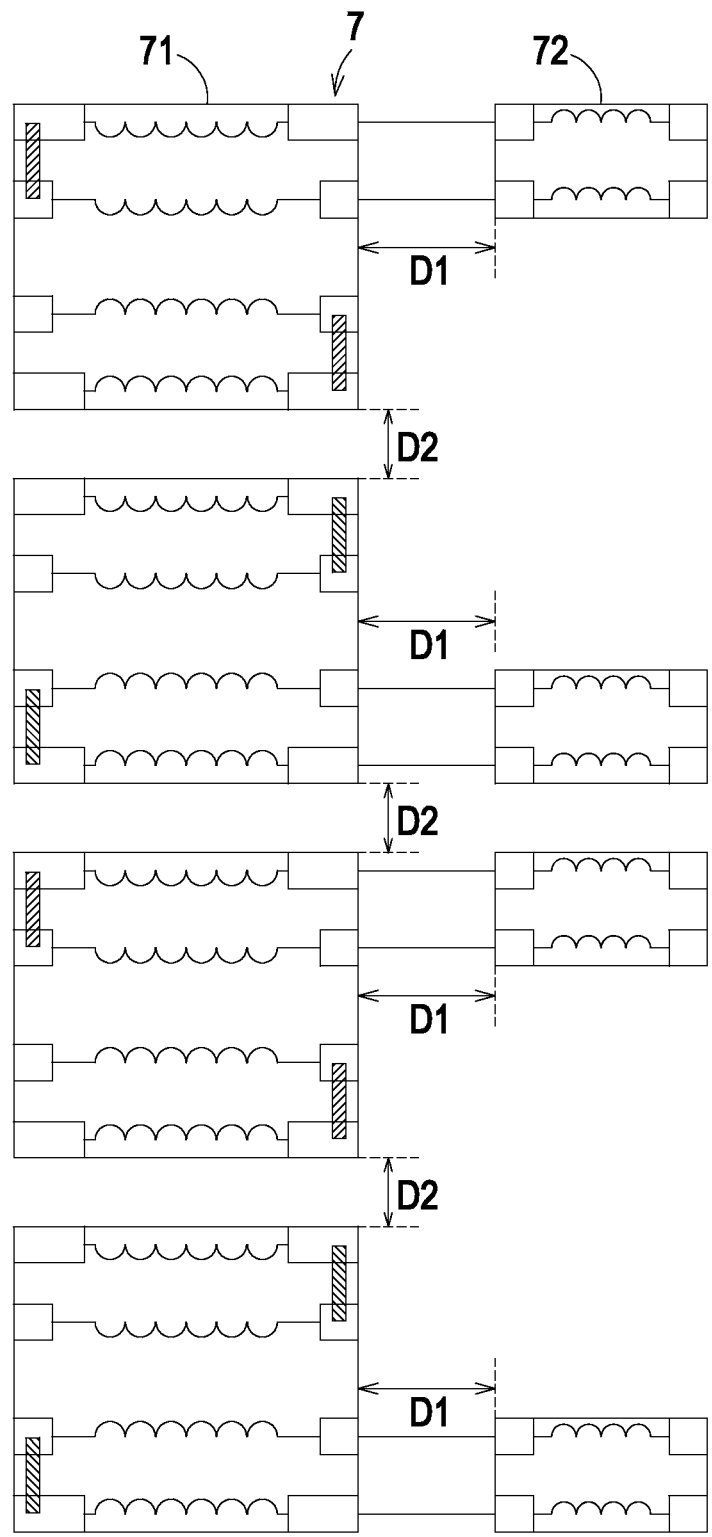
Figure 9C:
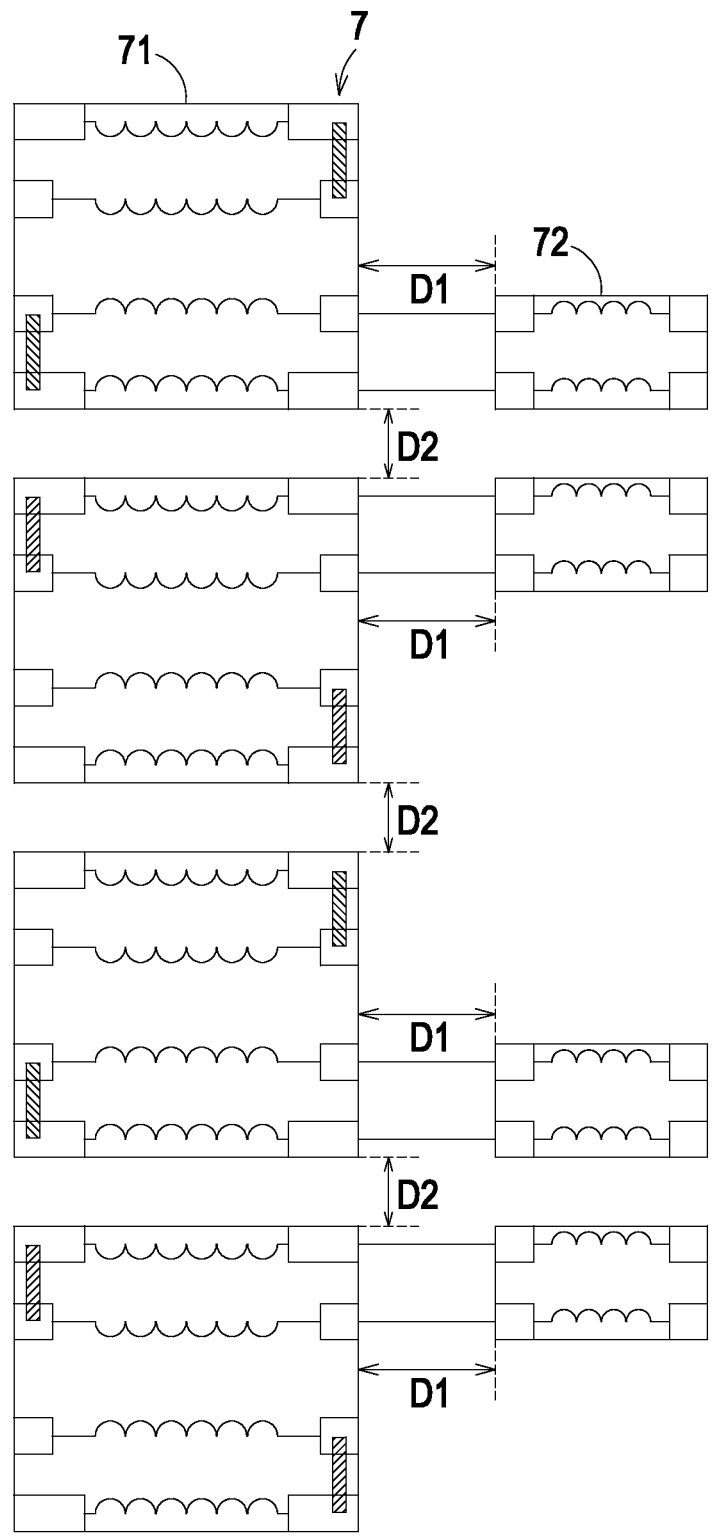

In some embodiment, the arrangements of the plural network magnetic assemblies disposed on the circuit board can be varied according to the practice requirements. FIGS. 9A, 9B and 9C show various arrangements of the plural network magnetic assemblies disposed on the circuit board. As shown in FIG. 9A, four network magnetic assemblies 7 of the network communication device 4 are disposed on the circuit board 5 in an arrangement structure of AAAA. The number "A" indicates that the network magnetic assembly is a network magnetic assembly in the first type as shown in FIG. 8A. In this embodiment, the Ethernet transformers 71 are disposed on the circuit board 5, and the Ethernet transformers 71 are arranged in a first line with a gap having a second specific length D2 between any two adjacent Ethernet transformers 71. Preferably, the second specific length D2 is 0.85 mm. The inductors 72 are disposed on the circuit board 5, and the inductors 72 are arranged in a second line in parallel with the first line.

In another embodiment, as shown in FIG. 9B, four network magnetic assemblies 7 of the network communication device 4 are disposed on the circuit board 5 in an arrangement structure of ABAB. The number "A" indicates that the network magnetic assembly is a network magnetic assembly in the first type as shown in FIG. 8A, and the number "B" indicates that the network magnetic assembly is a network magnetic assembly in the second type as shown in FIG. 8B. In this embodiment, the Ethernet transformers 71 are disposed on the circuit board 5, and the Ethernet transformers 71 are arranged in a first line with a gap having a second specific length D2 between any two adjacent Ethernet transformers 71. Preferably, the second specific length D2 is 0.5 mm. The inductors 72 are disposed on the circuit board 5, and the inductors 72 are arranged in a second line in parallel with the first line.

In another embodiment, as shown in FIG. 9C, four network magnetic assemblies 7 of the network communication device 4 are disposed on the circuit board 5 in an arrangement structure of BABA. The number "A" indicates that the network magnetic assembly is a network magnetic assembly in the first type as shown in FIG. 8A, and the number "B" indicates that the network magnetic assembly is a network magnetic assembly in the second type as shown in FIG. 8B. In this embodiment, the Ethernet transformers 71 are disposed on the circuit board 5, and the Ethernet transformers 71 are arranged in a first line with a gap having a second specific length D2 between any two adjacent Ethernet transformers 71. Preferably, the second specific length D2 is 0.5 mm. The inductors 72 are disposed on the circuit board 5, and the inductors 72 are arranged in a second line in parallel with the first line.

Figure 10:
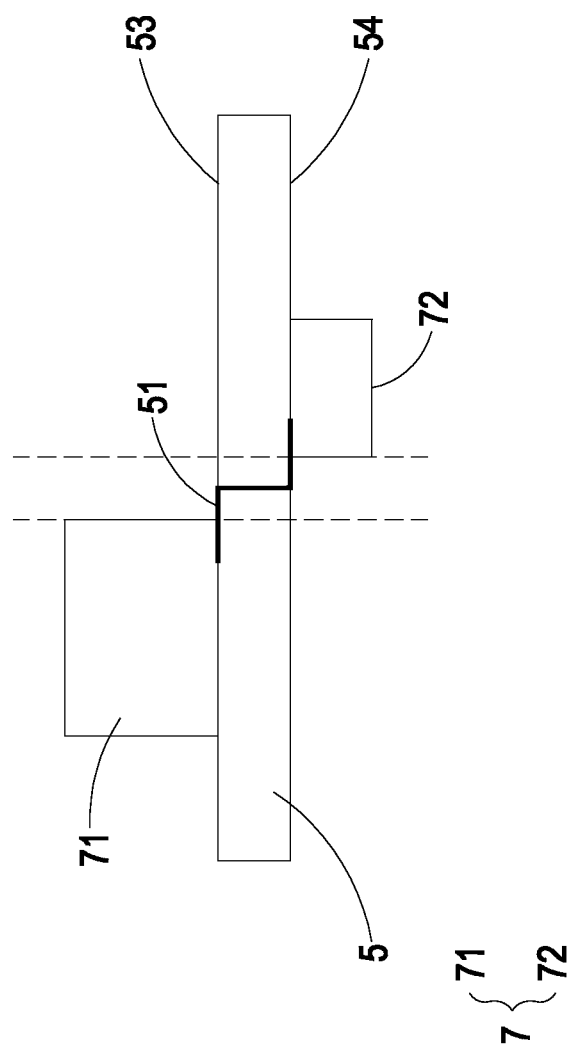
FIG. 10 is a schematic view showing the Ethernet transformer and the inductor of the network magnetic assembly is disposed on different surfaces of the circuit board.

In a network magnetic assembly 7, the Ethernet transformer 71 and the inductor 72 can be disposed on same surface or different surfaces of the circuit board 5. FIG. 10 is a schematic view showing the Ethernet transformer and the inductor of the network magnetic assembly is disposed on different surfaces of the circuit board. As shown in FIG. 10, the circuit board 5 includes a first surface 53 and a second surface 54. The Ethernet transformer 71 of the network magnetic assembly 7 is disposed on the first surface 53 of the circuit board 5, and the inductor 72 of the network magnetic assembly 7 is disposed on the second surface 54 of the circuit board 5. The inductor 72 is offset to the Ethernet transformer 71 and electrically connected with the Ethernet transformer 71 via a conductive trace 51, which is embedded in the circuit board 5. In this embodiment, the spaced distance between the Ethernet transformer 71 and the inductor 72 or the path length of the conductive trace 51 between the Ethernet transformer 71 and the inductor 72 is less than a first specific length D1. Preferably, the first specific length D1 is about 1 mm.

Figure 11A:
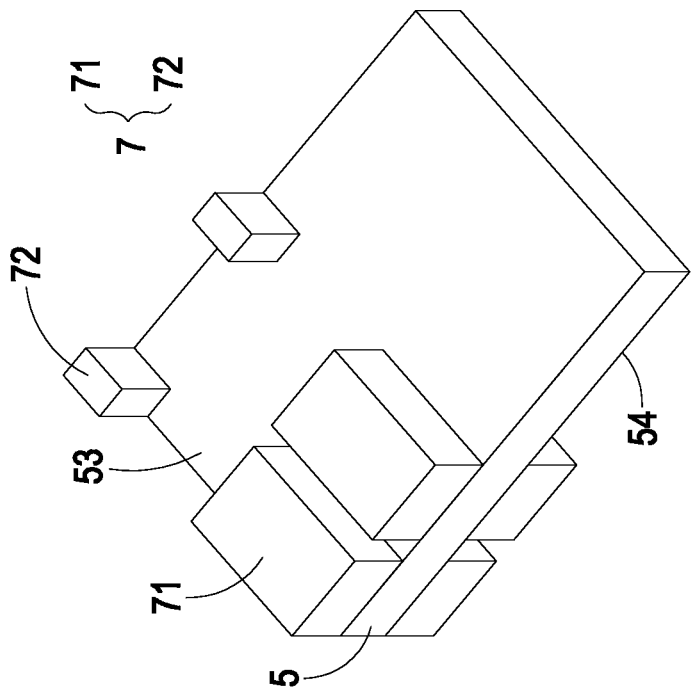
FIG. 11A is schematic view showing the network magnetic assemblies are disposed on same surface of the circuit board.
Figure 11B:
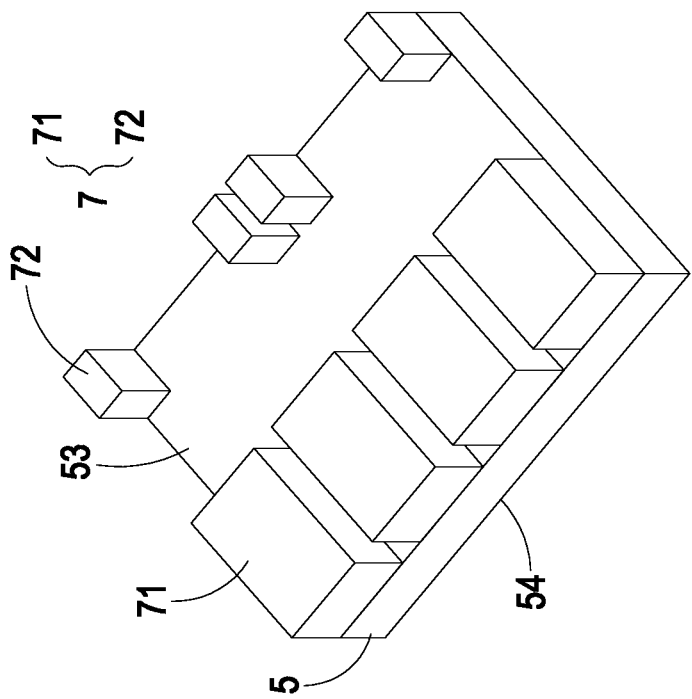
FIG. 11B is schematic view showing the network magnetic assemblies are disposed on different surfaces of the circuit board.

In some embodiment, the plural network magnetic assemblies 7 can be disposed on the same surface of the circuit board 5 or disposed on different surfaces of the circuit board 5. FIG. 11A is schematic view showing the network magnetic assemblies are disposed on same surface of the circuit board; and FIG. 11B is schematic view showing the network magnetic assemblies are disposed on different surfaces of the circuit board. In an embodiment, as shown in FIG. 11A, four network magnetic assemblies 7 are disposed on the first surface 53 of the circuit board 5. In another embodiment, as shown in FIG. 11B, two network magnetic assemblies 7 are disposed on the first surface 53 of the circuit board 5, and the other two network magnetic assemblies 7 are disposed on the second surface 54 of the circuit board 5. It is noted that arrangements of the network magnetic assemblies 7, which are disposed on the first surface 53 or the second surface 54 of the circuit board 5, are not limited to the examples as shown in FIGS. 11A and 11B. The arrangements of the network magnetic assemblies 7 on the circuit board 5 can be varied according to the practice requirement and the available space of the circuit board 5.

Figure 12:
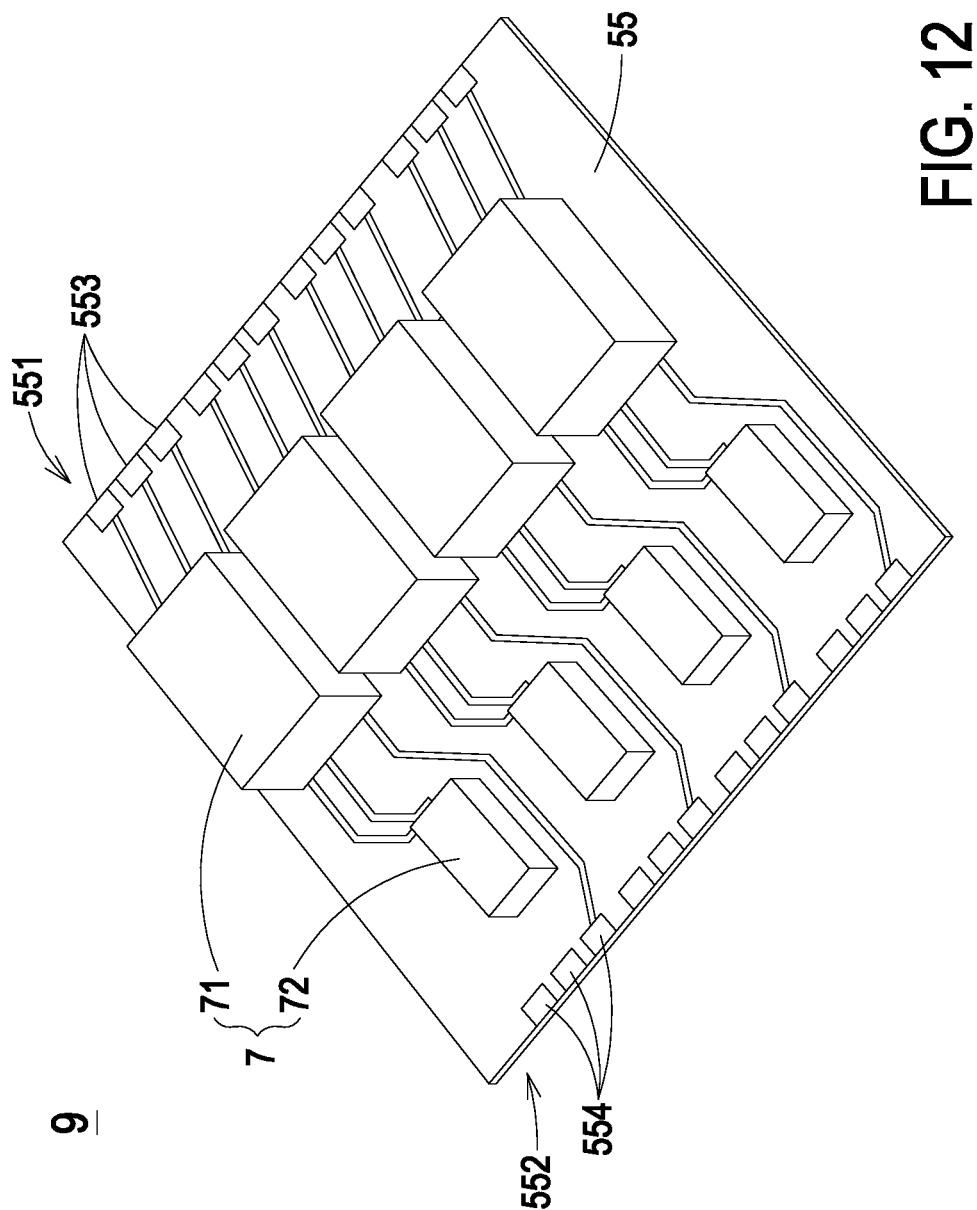
FIG. 12 is schematic view showing a network magnetic module of the present invention.

In some embodiment, as shown in FIG. 12, the circuit board 5 further includes a daughter board 55. The Ethernet transformers 71 and inductors 72 of the network magnetic assemblies 7 are disposed on the daughter board 55. The daughter board 55 has a first side edge 551 and a second side edge 552. The first side edge 551 is opposite to the second side edge 552. The daughter board 55 further includes a plurality of first contact fingers 553 disposed and separately arranged on the first side edge 551 and a plurality of second contact fingers 554 disposed and separately arranged on the second side edge 552. The positive terminals, the negative terminals and the central lines 713 of the primary winding sets 711 of the Ethernet transformers 71 (as shown in FIG. 3B) are electrically connected with first contact fingers 553 correspondingly. The positive terminals and the negative terminals of the first winding coils 721 and the second winding coils 722 of the inductors 72 and the central lines 714 of the secondary winding sets 712 of the Ethernet transformers 71 (as shown in FIG. 3B) are electrically connected with second contact fingers 553 correspondingly, so as to form a network magnetic module 9.

Figure 13A:
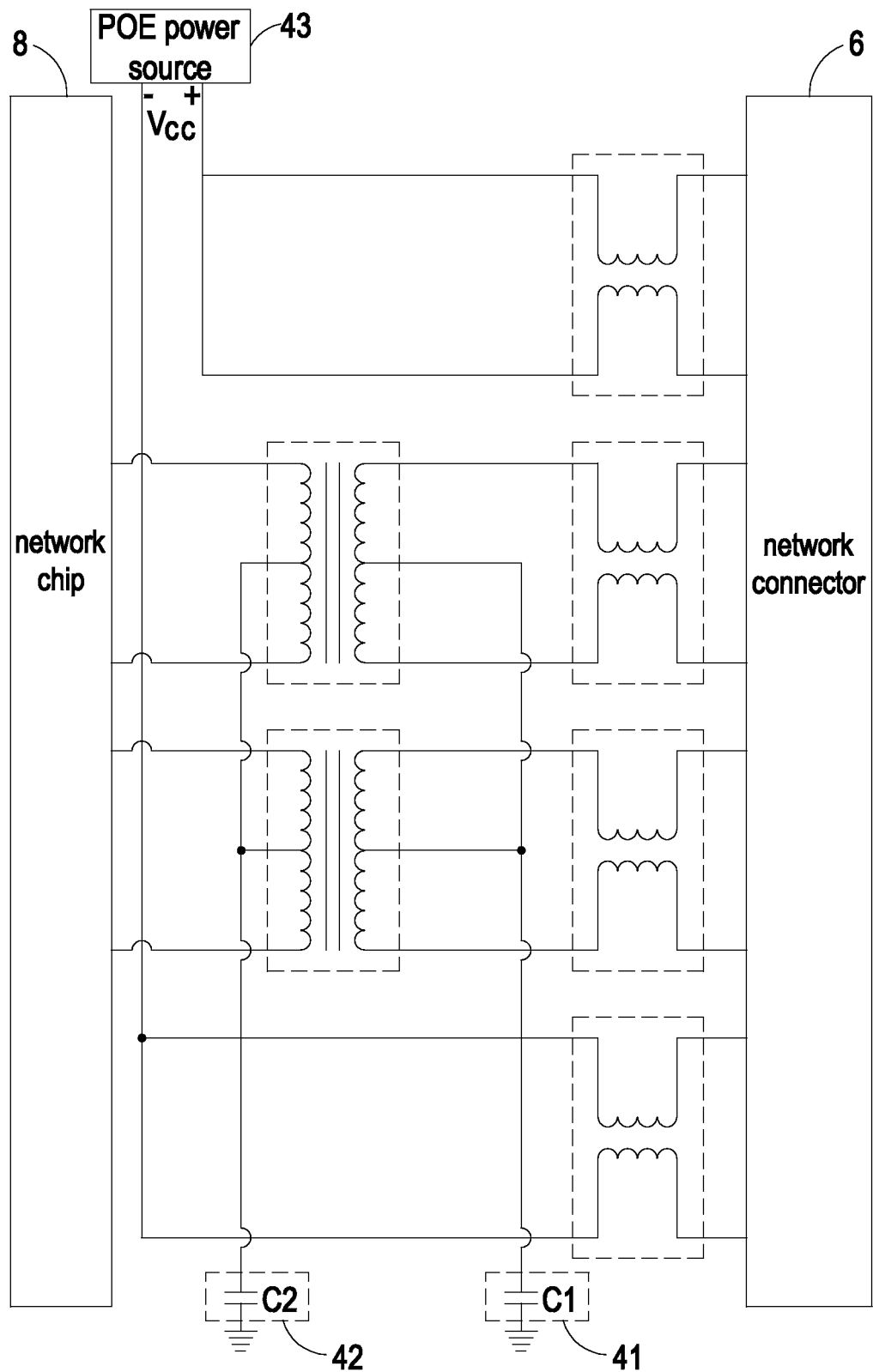
FIG. 13A is an equivalent circuit to the network communication device for use in Power Over Ethernet according to one embodiment of the present invention.
Figure 13B:
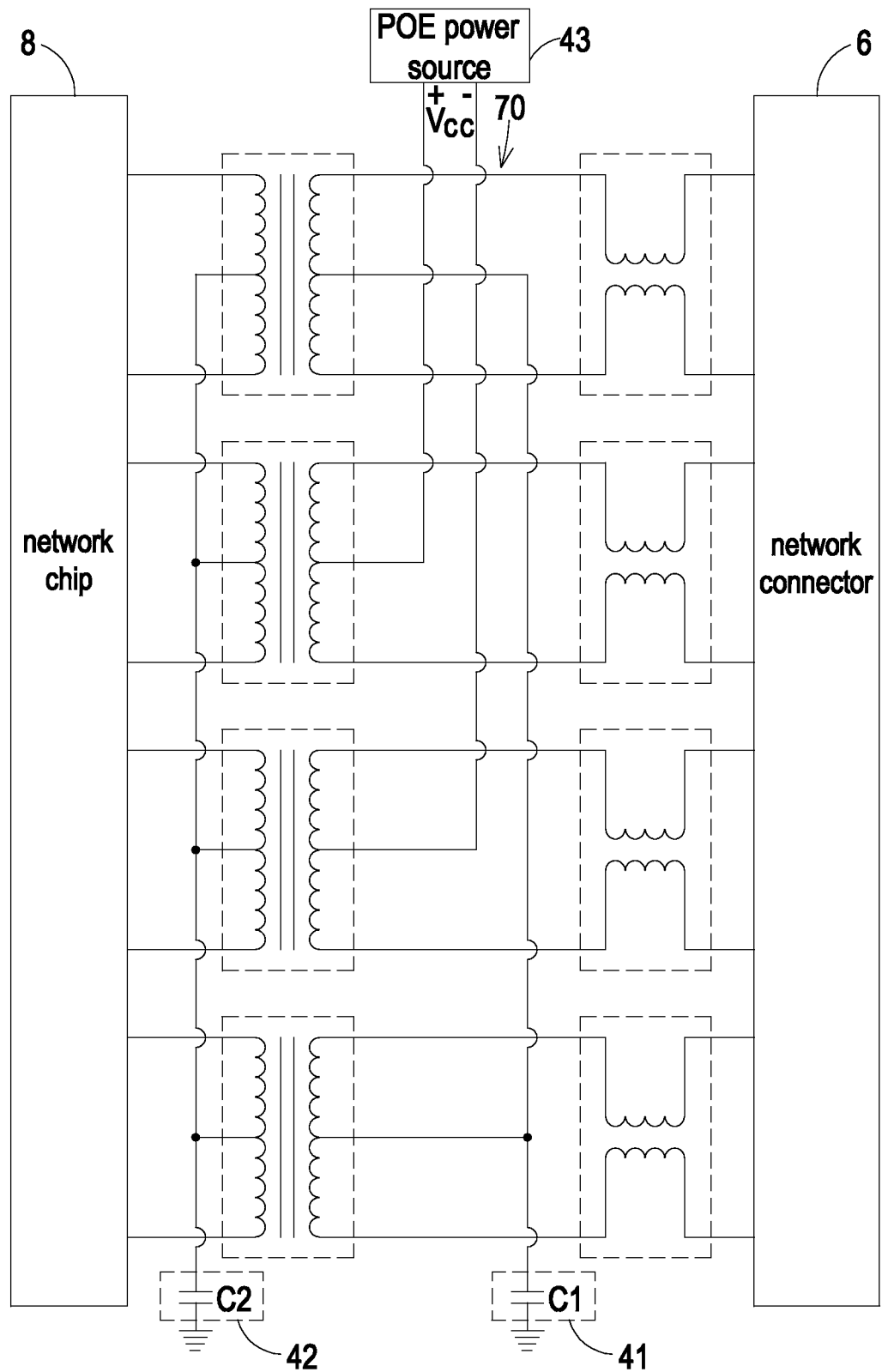
FIG. 13B is an equivalent circuit to the network communication device for use in Power Over Ethernet according to another embodiment of the present invention.

In the embodiment as shown in FIG. 3B, all of the four signal transmission channels 70 of the network communication device 4 are employed for transmitting the Ethernet physical layer signals (i.e. network signals). Alternatively, in some embodiments as shown in FIGS. 13A and 13B, the network communication device 4 can be used in Power Over Ethernet (POE) for transmitting DC power and performing signal transmission. When the network communication device 4 is used in Power Over Ethernet (POE), two of the four signal transmission channels 70 of the network communication device 4 are employed for transmitting DC power. The two signal transmission channels 70 are electrically connected with a Power Over Ethernet power source 43 (POE power source). Preferably, the Power Over Ethernet power source 43 is a DC power source Vcc. The Power Over Ethernet power source 43 is configured to provide a DC voltage having a level ranged from 44V to 57V.

Figure 14A:
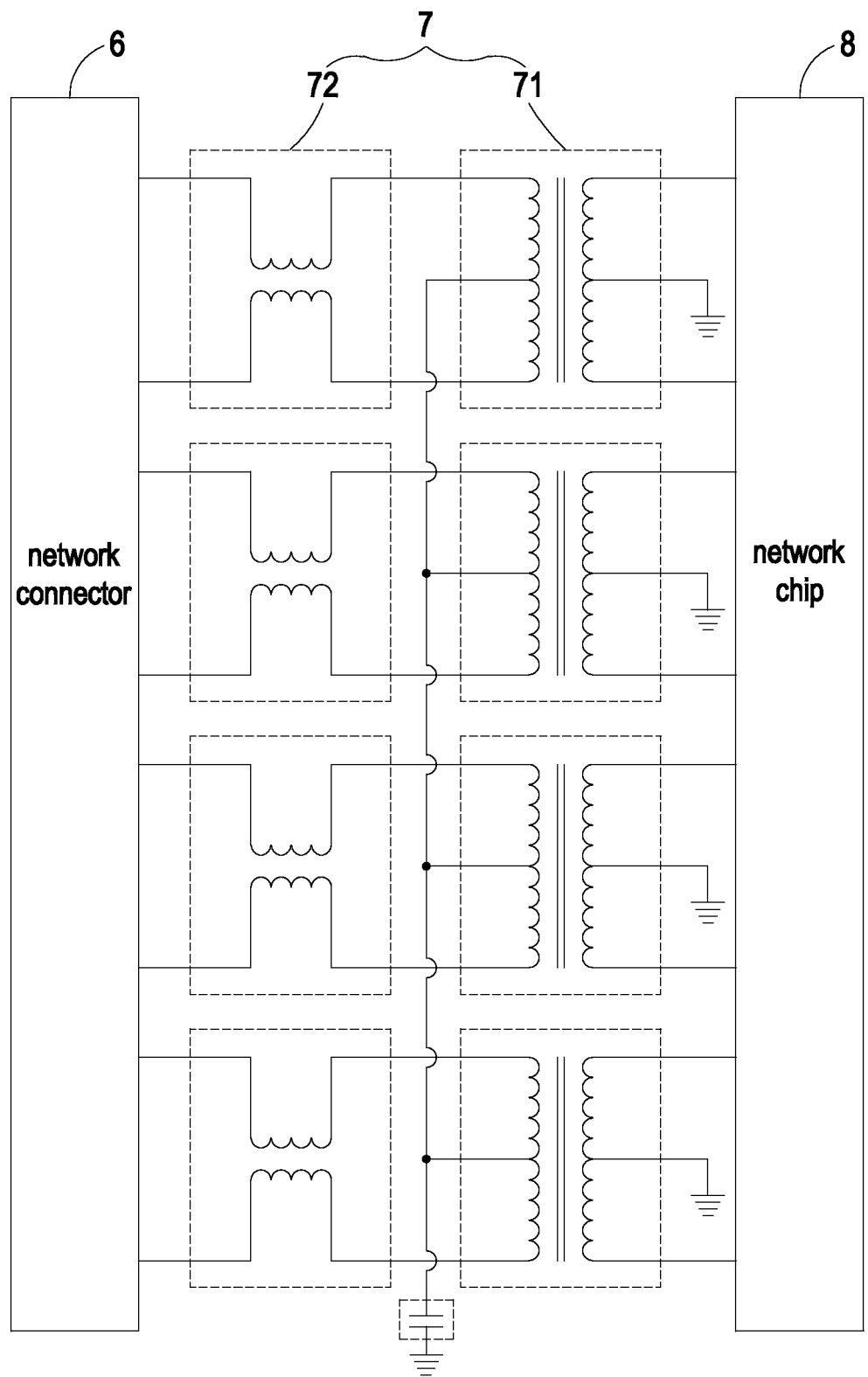
FIG. 14A is an equivalent circuit to the network communication device according to another embodiment of the present invention.
Figure 14B:
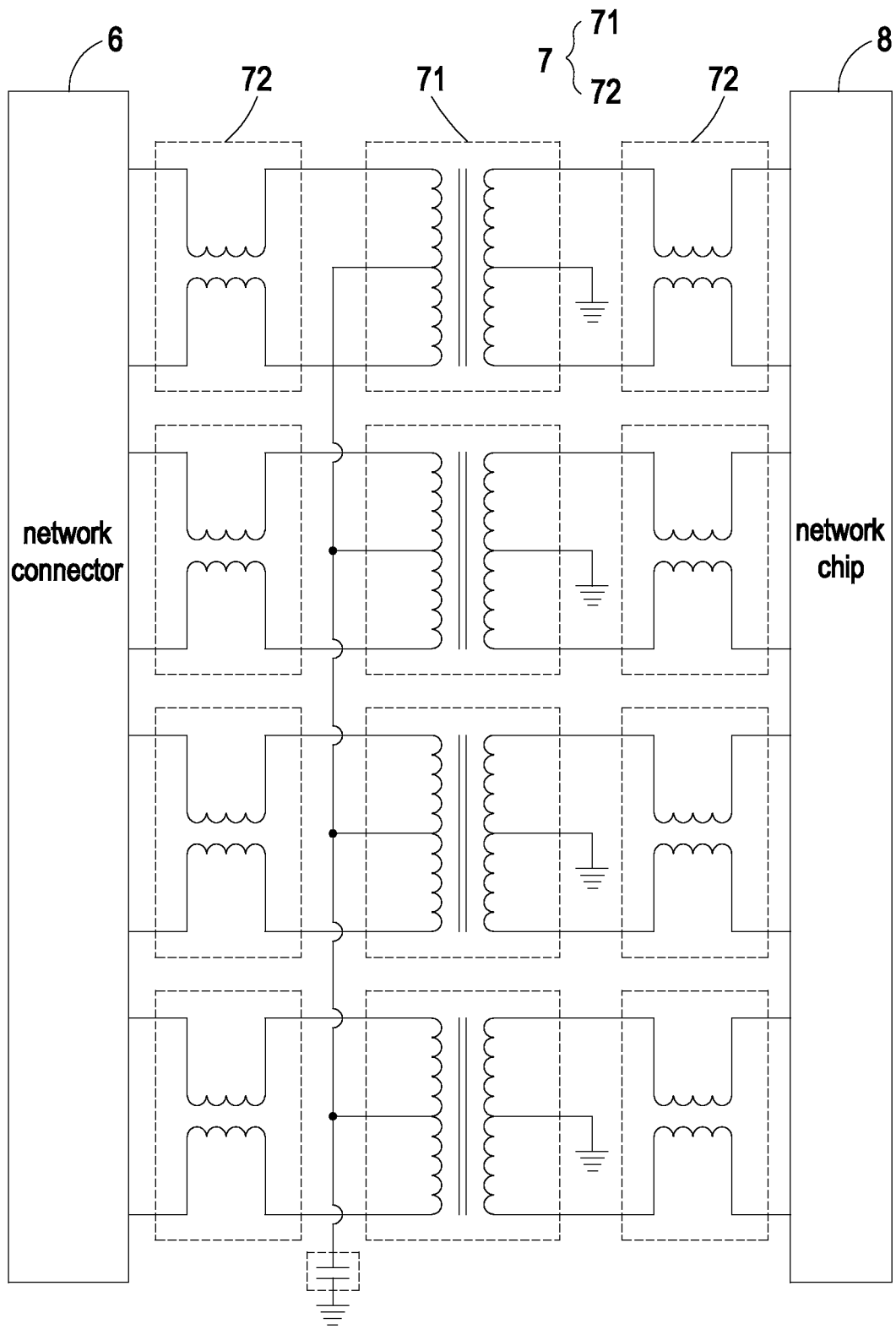
FIG. 14B is an equivalent circuit to the network communication device according to another embodiment of the present invention.

In each network magnetic assembly 7, the at least one inductor 72 can be electrically connected to the primary side, the secondary side or both sides of the Ethernet transformer 71. As shown in FIGS. 3A and 3B, each network magnetic assembly 7 includes an Ethernet transformer 71 and an inductor 72. The inductor 72 is electrically connected with and between the Ethernet transformer 71 and the network chip 8. In another embodiment, as shown in FIG. 14A, each network magnetic assembly 7 includes an Ethernet transformer 71 and an inductor 72. The inductor 72 is electrically connected with and between the Ethernet transformer 71 and the network connector 6. In another embodiment, as shown in FIG. 14B, each network magnetic assembly 7 includes an Ethernet transformer 71 and two inductor 72. The first inductor 72 is electrically connected with and between the Ethernet transformer 71 and the network chip 8, and the second inductor 72 is electrically connected with and between the Ethernet transformer 71 and the network connector 6.

From the above description, the present invention provides a network communication device including a circuit board, a network connector, a network chip, and a plurality of network magnetic assemblies. The inventive network communication device can suppress or reduce the electromagnetic interference effectively due to the specific arrangements of the Ethernet transformers 71 and the inductors 72 and due to the high magnetic efficiency, low magnetic loss, low interaction effect and more slim structures of the Ethernet transformers 71 and the inductors 72. The Ethernet transformers 71 and the inductors 72 of the inventive network communication device doesn't occupy more complete regions and spaces of the circuit board, and the arrangements of circuits and electronic elements and the utilizations of the space on the circuit board are more convenient and flexible according to the practice requirement. In addition, the miniaturizations of the products are easy to be achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A network communication device, comprising:
    a circuit board;
    a network connector disposed on the circuit board;
    a network chip disposed on the circuit board; and
    a plurality of network magnetic assemblies disposed on the circuit board and electrically connected with the network connector and the network chip, respectively, wherein each of the network magnetic assemblies includes an Ethernet transformer and at least one inductor, and the Ethernet transformer is electrically connected in series with the inductor via a conductive trace of the circuit board, wherein a spaced distance or a path length of the conductive trace between the Ethernet transformer and the inductor of at least one network magnetic assembly is less than a first specific length;
    wherein the Ethernet transformer comprises:
    a magnetic core assembly including a first magnet core and a second magnet core, wherein the first magnet core comprises a plurality of contact pin sets;
    at least one primary winding set wound around the first magnet core and electrically connected with a portion of the contact pin sets of the first magnet core; and
    at least one secondary winding set wound around the first magnet core and electrically connected with the other portion of the contact pin sets of the first magnet core.

2. The network communication device according to claim 1, wherein the network connector is a RJ45 connector, and the network chip is a Physical Layer Integrated Circuit.

3. The network communication device according to claim 1, wherein the Ethernet transformer is a surface mount transformer or a chip transformer, and the inductor is a surface mount inductor or a chip inductor.

4. The network communication device according to claim 1, wherein the first magnet core is a drum-shaped magnet core, and the second magnet core is a plate-shaped magnet core.

5. The network communication device according to claim 1, wherein the inductor comprises:
    a magnetic core assembly including a first magnet core and a second magnet core, wherein the first magnet core comprises a plurality of contact pins;

a first winding coil wound around the first magnet core and electrically connected with a portion of the contact pins of the first magnet core; and a second winding coil wound around the first magnet core and electrically connected with the other portion of the contact pins of the first magnet core.

6. The network communication device according to claim 1, wherein the conductive trace includes a first conductive line and a second conductive line, and the first conductive line is in parallel with the second conductive line.

7. The network communication device according to claim 1, wherein the first specific length is 1 mm.

8. The network communication device according to claim 1, wherein the path lengths of the conductive traces of the signal transmission channels are the same.

9. The network communication device according to claim 1, wherein each of the network magnetic assemblies includes one Ethernet transformer and one inductor, wherein the inductor is electrically connected with and between the Ethernet transformer and the network chip, or the inductor is electrically connected with and between the Ethernet transformer and the network connector.

10. The network communication device according to claim 1, wherein each of the network magnetic assemblies includes one Ethernet transformer and two inductors, wherein one of the two inductor is electrically connected with and between the Ethernet transformer and the network chip, and the other of the two inductor is electrically connected with and between the Ethernet transformer and the network connector.

11. The network communication device according to claim 1, wherein the Ethernet transformers are arranged with a gap having a second specific length between any two adjacent Ethernet transformers.

12. The network communication device according to claim 11, wherein the second specific length is ranged from 0.5 mm to 1.35 mm.

13. The network communication device according to claim 1, wherein the network magnetic assemblies are disposed on the same surface of the circuit board or different surfaces of the circuit board.

14. The network communication device according to claim 1, wherein the Ethernet transformer and the inductor of each the network magnetic assembly are disposed on the same surface of the circuit board or different surfaces of the circuit board.

15. The network communication device according to claim 1, wherein the circuit board further comprises a daughter board, and the network magnetic assemblies are disposed on the daughter board to form a network magnetic module.

16. The network communication device according to claim 1, wherein the Ethernet transformer comprises a plurality of contact pins, and the circuit board comprises a solder area, wherein the solder area comprises a plurality of solder pads, a first connection line and a second connection line, wherein the solder pads are electrically connected with the contact pins of the Ethernet transformer respectively, the first connection line is connected with a pair of the solder pads, and the second connection line is connected with another pair of the solder pads.

17. A network communication device, comprising:
a circuit board;
a network connector;
a network chip; and
at least one signal transmission channel electrically connected with the network connector and the network chip, wherein the signal transmission channel comprises an Ethernet transformer and an inductor, the Ethernet transformer and the inductor are respectively single modules and disposed on the circuit board, and the Ethernet transformer is electrically connected in series with the inductor via a conductive trace of the circuit board, wherein a spaced distance or a path length of the conductive trace between the Ethernet transformer and the inductor is less than a first specific length;
wherein the Ethernet transformer comprises:
a magnetic core assembly including a first magnet core and a second magnet core, wherein the first magnet core comprises a plurality of contact pin sets;
at least one primary winding set wound around the first magnet core and electrically connected with a portion of the contact pin sets of the first magnet core; and
at least one secondary winding set wound around the first magnet core and electrically connected with the other portion of the contact pin sets of the first magnet core.

* * * * *